United States Patent
Hirose et al.

(10) Patent No.: US 9,234,277 B2
(45) Date of Patent: Jan. 12, 2016

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshiro Hirose, Toyama (JP); Ryuji Yamamoto, Kodaira (JP); Atsushi Sano, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/197,920

(22) Filed: Mar. 5, 2014

(65) Prior Publication Data

US 2014/0273507 A1    Sep. 18, 2014

(30) Foreign Application Priority Data

Mar. 12, 2013    (JP) ................. 2013-049179

(51) Int. Cl.

| | |
|---|---|
| H01L 21/31 | (2006.01) |
| H01L 21/469 | (2006.01) |
| H01L 21/00 | (2006.01) |
| C23C 16/36 | (2006.01) |
| C23C 16/455 | (2006.01) |
| H01L 21/02 | (2006.01) |

(52) U.S. Cl.
CPC ........... *C23C 16/36* (2013.01); *C23C 16/45525* (2013.01); *H01L 21/0228* (2013.01); *H01L 21/02167* (2013.01); *H01L 21/02211* (2013.01); *H01L 21/02274* (2013.01)

(58) Field of Classification Search
CPC ................. H01L 21/10204; H01L 21/02271; H01L 21/67; C23C 16/36
USPC .................................... 438/62, 697
See application file for complete search history.

(56) References Cited

U.S. PATENT DOCUMENTS

| | | | |
|---|---|---|---|
| 5,188,757 A * | 2/1993 | Paine et al. .............. | 252/183.11 |
| 2006/0097393 A1* | 5/2006 | Uchimaru et al. ............ | 257/758 |
| 2009/0232987 A1* | 9/2009 | Kumada et al. .......... | 427/255.38 |

FOREIGN PATENT DOCUMENTS

| | | |
|---|---|---|
| JP | 2007324536 A | 12/2007 |
| JP | 2011521452 A | 7/2011 |
| WO | 2009140094 A2 | 11/2009 |

* cited by examiner

*Primary Examiner* — David S Blum
(74) *Attorney, Agent, or Firm* — Volpe and Koenig, P.C.

(57) ABSTRACT

A method of manufacturing a semiconductor device is disclosed. The method includes forming a thin film having a borazine ring skeleton and containing a predetermined element, boron, carbon, and nitrogen on a substrate by performing a cycle a predetermined number of times. The cycle includes supplying a precursor gas containing the predetermined element and a halogen element to the substrate; supplying a reaction gas including an organic borazine compound to the substrate; and supplying a carbon-containing gas to the substrate. In addition, the cycle is performed under a condition in which the borazine ring skeleton in the organic borazine compound is maintained.

13 Claims, 17 Drawing Sheets

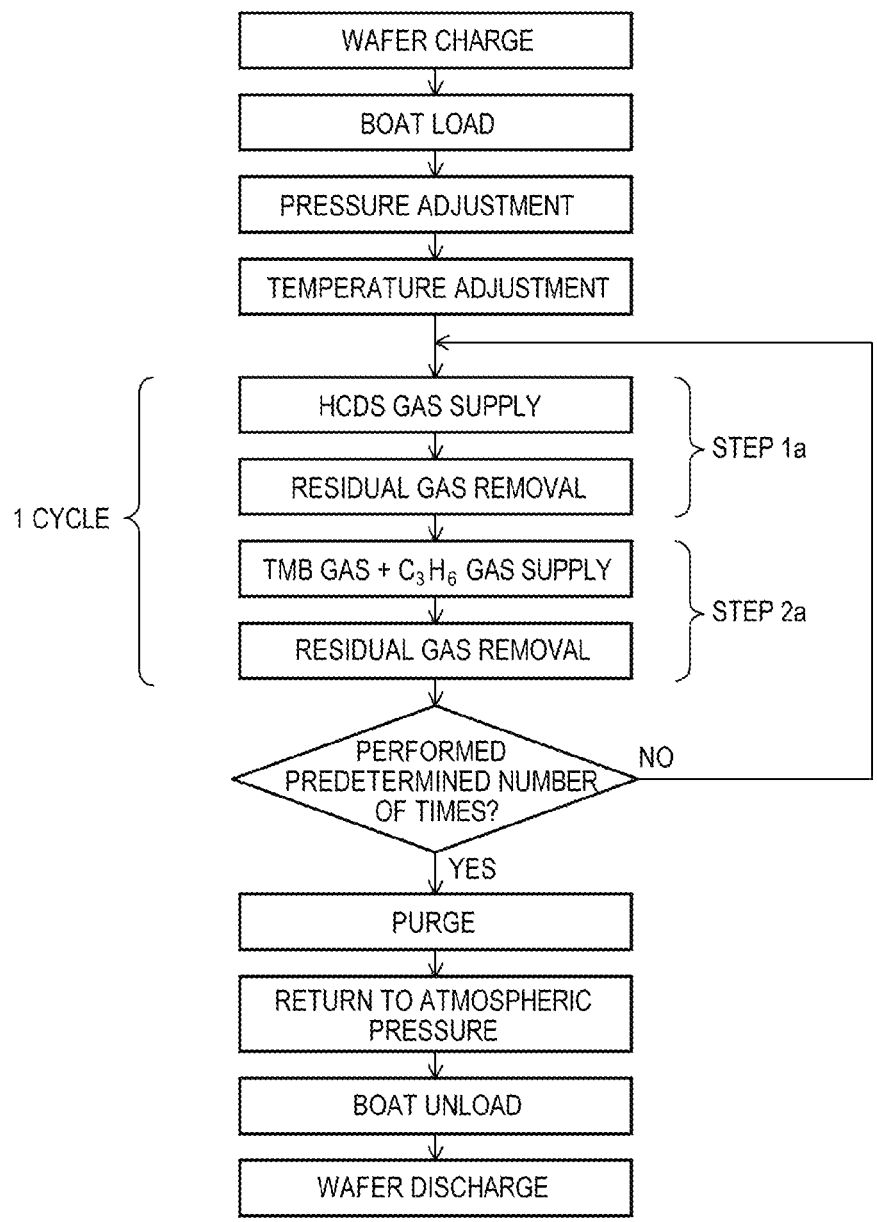

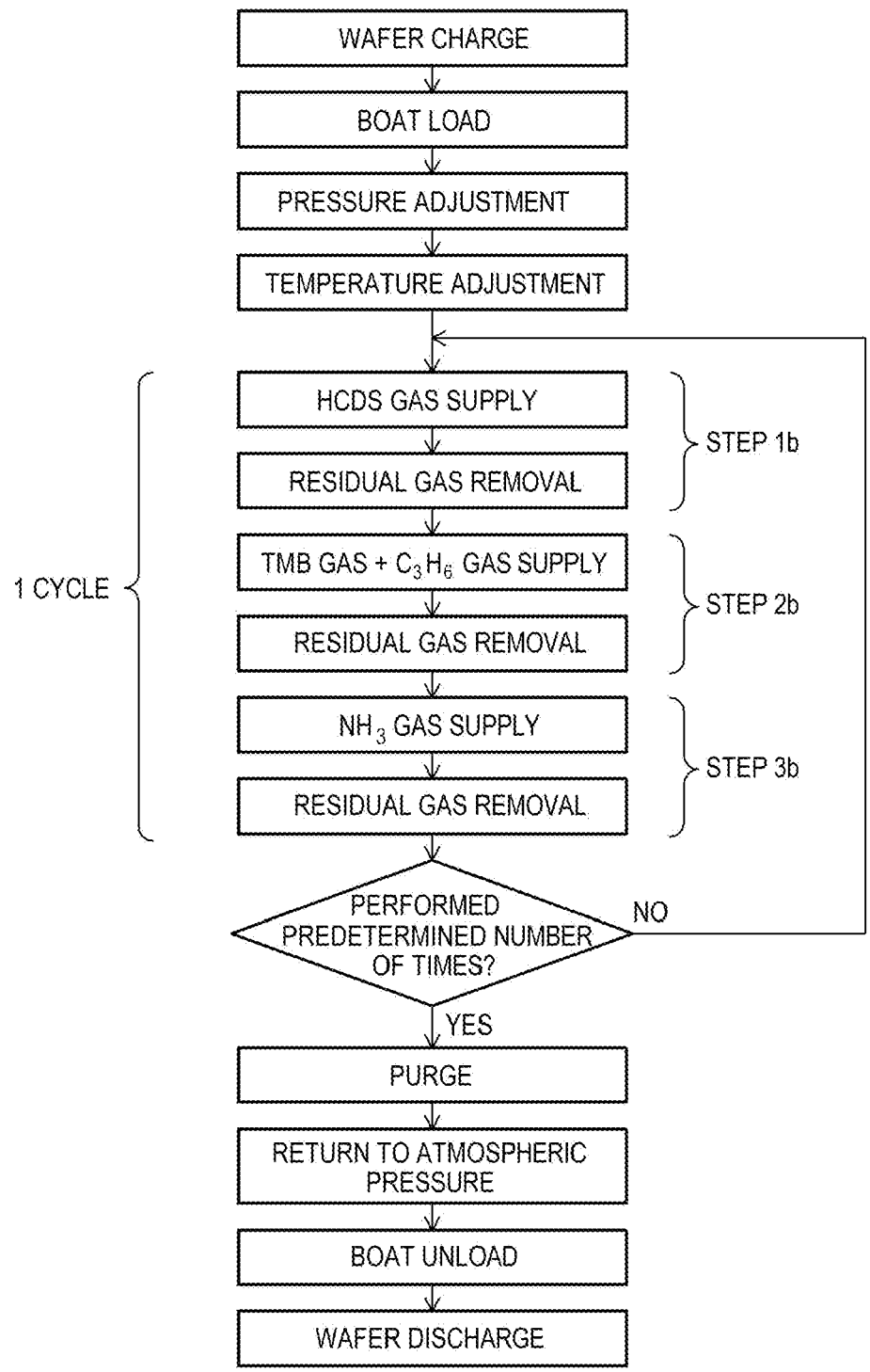

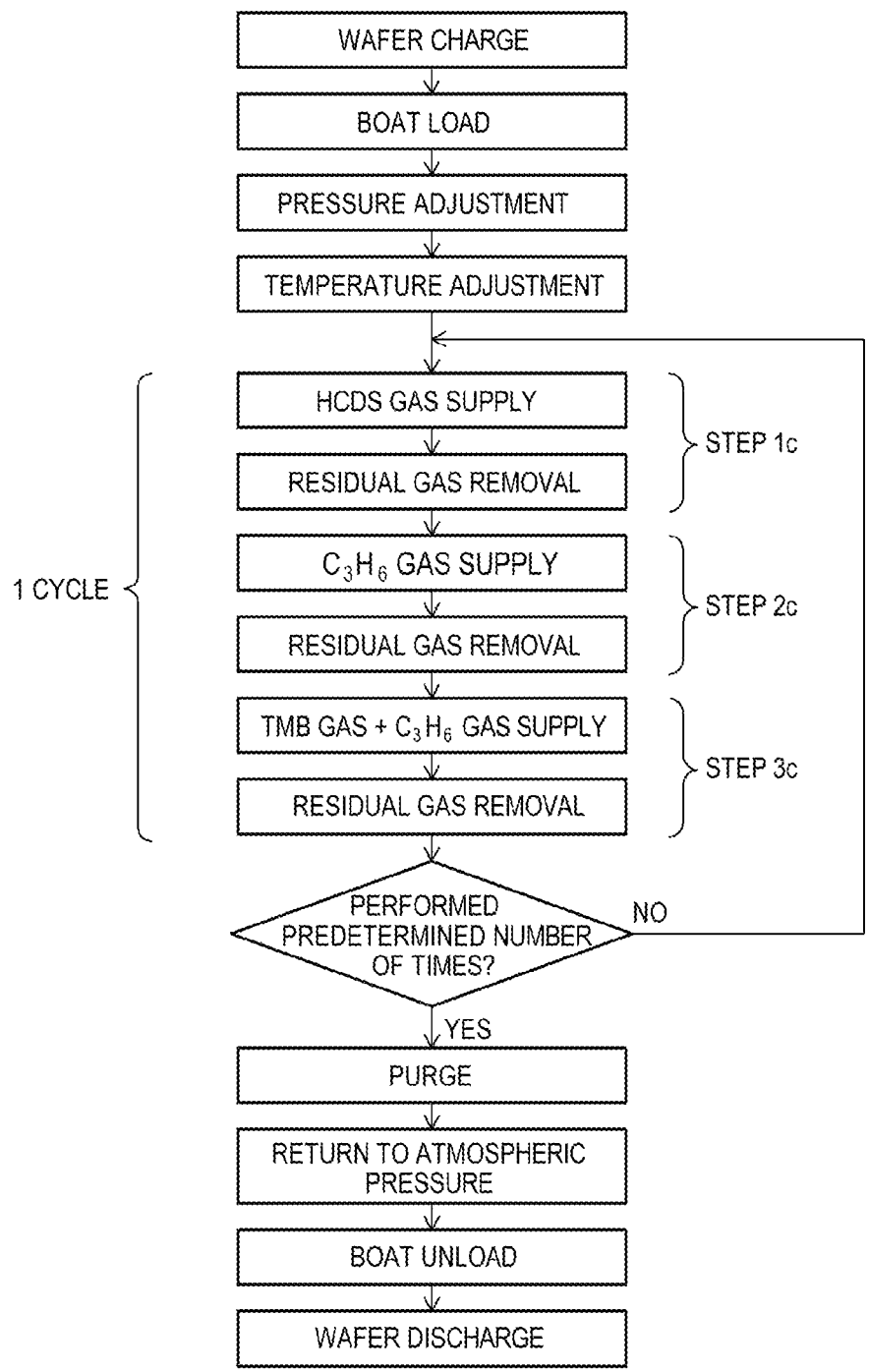

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-049179, filed on Mar. 12, 2013, the entire contents of which are incorporated herein by reference.

TECHNICAL FIELD

The present disclosure relates to a method of manufacturing a semiconductor device, a substrate processing apparatus, and a recording medium, which perform a process of forming a thin film on a substrate, or operate a device to perform a process of forming a thin film on a substrate.

BACKGROUND

As sizes of transistors decrease, a thin film such as an insulating film which constitutes a sidewall spacer (SWS) of a gate electrode or the like may require a low temperature for film forming, an improved resistance to hydrogen fluoride (HF), and a small dielectric constant. To this end, it has been studied to use a silicon borocarbonitride (SiBCN) film obtained by adding boron (B) and carbon (C) to a silicon nitride film (SiN film) as an insulating film.

Such an insulating film is often formed by an alternating supply method that alternately supplies several kinds of process gases because high step coverage characteristics are required. For example, using a silicon (Si)-containing gas as a precursor gas (i.e., a silicon precursor), borontrichloride ($BCl_3$) gas or diborane ($B_2H_6$) gas as a boron precursor, ammonia ($NH_3$) gas as a nitrogen source, and ethylene ($C_2H_4$) gas or propylene ($C_3H_6$) gas as a carbon source, a SiBCN film can be formed on a substrate by performing a predetermined number of times a cycle that sequentially supplies those process gases to the substrate. However, the method that separately supplies the silicon precursor, the boron precursor, the nitrogen source, and the carbon source leads to a longer time for performing a single cycle, which results in a low productivity of a film forming process. Furthermore, in the method as described above, it is difficult to increase a C concentration in the SiBCN film and thus improve the resistance to HF.

SUMMARY

The present disclosure provides some embodiments of a method of manufacturing a semiconductor device, a substrate processing apparatus, and a recording medium, which are capable of forming a thin film having a high resistance to HF and a low dielectric constant in a low temperature region with a high productivity.

According to one embodiment of the present disclosure, there is provided a method of manufacturing a semiconductor device, the method including forming a thin film having a borazine ring skeleton and containing a predetermined element, boron, carbon, and nitrogen on a substrate by performing a cycle a predetermined number of times, the cycle including: supplying a precursor gas containing the predetermined element and a halogen element to the substrate; supplying a reaction gas including an organic borazine compound to the substrate; and supplying a carbon-containing gas to the substrate, wherein the cycle is performed under a condition in which the borazine ring skeleton in the organic borazine compound is maintained.

According to another aspect of the present disclosure, there is provided a substrate processing apparatus, including: a process chamber configured to accommodate a substrate; a precursor gas supply system configured to supply a precursor gas containing a predetermined element and a halogen element into the process chamber; a reaction gas supply system configured to supply a reaction gas including an organic borazine compound into the process chamber; a carbon-containing gas supply system configured to supply a carbon-containing gas into the process chamber; a heater configured to heat the substrate in the process chamber; a pressure adjuster configured to adjust an internal pressure of the process chamber; and a controller configured to control the precursor gas supply system, the reaction gas supply system, the carbon-containing gas supply system, the heater, and the pressure adjuster so as to form a thin film having a borazine ring skeleton and containing the predetermined element, boron, carbon, and nitrogen on the substrate by performing a cycle a predetermined number of times, the cycle including: supplying the precursor gas to the substrate in the process chamber; supplying the reaction gas to the substrate in the process chamber; and supplying the carbon-containing gas to the substrate in the process chamber, wherein the cycle is performed under a condition in which the borazine ring skeleton in the organic borazine compound is maintained.

According to still another embodiment of the present disclosure, there is provided a non-transitory computer-readable recording medium storing a program that causes a computer to perform a process of forming a thin film having a borazine ring skeleton and containing a predetermined element, boron, carbon, and nitrogen on a substrate by performing a cycle a predetermined number of times, the cycle including: supplying a precursor gas containing the predetermined element and a halogen element to the substrate in a process chamber; supplying a reaction gas including an organic borazine compound to the substrate in the process chamber; and supplying a carbon-containing gas to the substrate in the process chamber, wherein the cycle is performed under a condition in which the borazine ring skeleton in the organic borazine compound is maintained.

BRIEF DESCRIPTION OF THE DRAWINGS

FIG. 4 illustrates a flowchart of a method for film forming in a film forming sequence according to a first embodiment of the present disclosure.

FIG. 6 illustrates a flowchart of a method for film forming in a first film forming sequence according to a second embodiment of the present disclosure.

FIG. 10 illustrates a flowchart of a method for film forming in a film forming sequence according to a third embodiment of the present disclosure.

DETAILED DESCRIPTION

First Embodiment of the Present Disclosure

Figure 1:
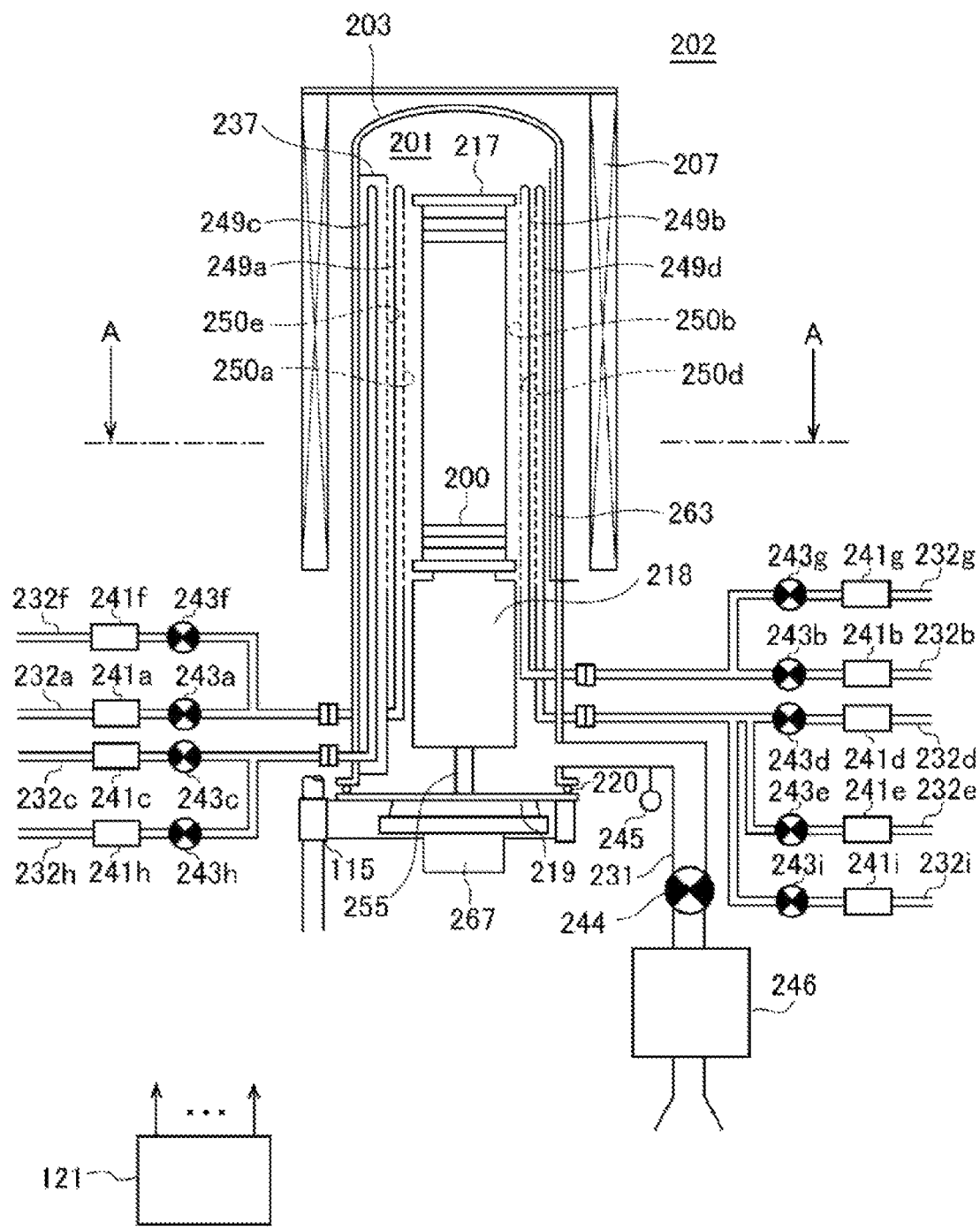
FIG. 1 schematically illustrates a configuration of a vertical processing furnace of a substrate processing apparatus appropriately employed in one embodiment of the present disclosure, in which a portion of the processing furnace is shown in a longitudinal sectional view.
Figure 2:
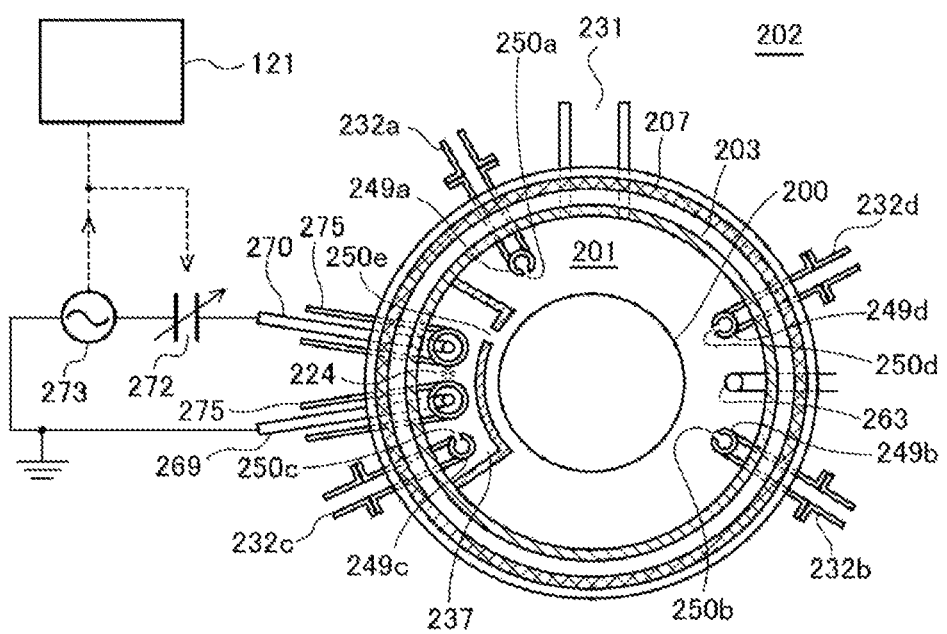
FIG. 2 schematically illustrates a configuration of the vertical processing furnace of the substrate processing apparatus appropriately employed in an embodiment of the present disclosure, in which a portion of the processing furnace is shown in a cross-sectional view taken along a line A-A in FIG. 1.

A first embodiment of the present disclosure is described below in detail with reference to the accompanying drawings.
(1) Configuration of Substrate Processing Apparatus FIG. 1 schematically illustrates a configuration of a vertical processing furnace 202 of a substrate processing apparatus appropriately employed in the present embodiment, in which a portion of the processing furnace 202 is shown in a longitudinal sectional view. FIG. 2 schematically illustrates a configuration of the vertical processing furnace 202 of the substrate processing apparatus appropriately employed in the present embodiment, in which a portion of the processing furnace 202 is shown in a sectional view taken along a line A-A in FIG. 1.

As illustrated in FIG. 1, the processing furnace 202 has a heater 207 serving as a heating unit (i.e., a heating mechanism). The heater 207 is of a cylindrical shape, and is supported by a heater base (not shown) serving as a support plate and vertically arranged. The heater 207 also acts as an activation mechanism (or an exciting unit) configured to activate (or excite) gas by heat, which will be described later.

A reaction tube 203 constituting a reaction vessel (i.e., a process vessel) is installed inside the heater 207 to be concentric with the heater 207. The reaction tube 203 is made of a heat resistant material such as quartz (i.e., $SiO_2$) or silicon carbide (SiC) and has a cylindrical shape with its upper end closed and its lower end opened. A process chamber 201 is formed in a hollow cylindrical portion of the reaction tube 203. The process chamber 201 is configured to accommodate a plurality of wafers 200 as substrates in such a state that the wafers 200 are horizontally stacked in multiple stages along a vertical direction by a boat 217 which will be described later.

A first nozzle 249a, a second nozzle 249b, a third nozzle 249c, and a fourth nozzle 249d penetrate through a lower portion of the reaction tube 203 to be installed in the process chamber 201. A first gas supply pipe 232a, a second gas supply pipe 232b, a third gas supply pipe 232c, and a fourth gas supply pipe 232d are connected to the first nozzle 249a, the second nozzle 249b, the third nozzle 249c, and the fourth nozzle 249d, respectively. A fifth gas supply pipe 232e is connected to the fourth gas supply pipe 232d. In this manner, the four nozzles 249a to 249d and the five gas supply pipe 232a to 232e are installed to the reaction tube 203 to supply plural types of gases, in this example, five kinds of gases, into the process chamber 201.

In addition, a manifold made of metal that supports the reaction tube 203 may be installed under the reaction tube 203 such that each nozzle is configured to penetrate through a sidewall of the metal manifold. In this case, an exhaust pipe 231, which will be described later, may be further installed in the metal manifold. In one embodiment, the exhaust pipe 231 may be installed to a lower portion of the reaction tube 203 rather than the metal manifold. In the manner as described above, a furnace port of the processing furnace 202 may be formed of metal, and the nozzle may be installed in the metal furnace port.

A mass flow controller (MFC) 241a serving as a flow rate controller (i.e., a flow control unit) and a valve 243a serving as an opening/closing valve are sequentially installed in the first gas supply pipe 232a from an upstream side. A first inert gas supply pipe 232f is connected to the first gas supply pipe 232a at a more downstream side of the valve 243a. A mass flow controller (MFC 241f) serving as a flow rate controller (i.e., a flow rate control unit) and a valve 243f serving as an opening/closing valve are sequentially installed in the first inert gas supply pipe 232f from an upstream side. In addition, the above-described first nozzle 249a is connected to an end of the first gas supply pipe 232a. The first nozzle 249a is installed in an arc-shaped space between an inner wall of the reaction tube 203 and the wafers 200 such that the first nozzle 249a extends upward in a stacked direction of the wafers 200 from a lower portion of the inner wall of the reaction tube 203 to an upper portion thereof. Specifically, the first nozzle 249a is installed along a wafer arrangement region where the wafers 200 are arranged, and in a region that horizontally surrounds the wafer arrangement region at a side of the wafer arrangement region. The first nozzle 249a is configured as an L-shaped nozzle, and its horizontal portion is installed to penetrate a lower sidewall of the reaction tube 203 while its vertical portion is installed to ascend at least from one end portion to the other end portion of the wafer arrangement region. A gas supply hole 250a for supplying gas is installed on a side surface of the first nozzle 249a. The gas supply hole 250a is opened toward a center of the reaction tube 203 to allow the gas to be supplied to the wafers 200. A plurality of gas supply holes 250a is installed at a predetermined opening pitch from a lower portion to an upper portion of the reaction tube 203. An opening area for each of the gas supply holes 250a may be the same.

A first gas supply system mainly includes the first gas supply pipe 232a, the MFC 241a, and the valve 243a. The first gas supply system may also include the first nozzle 249a. In addition, a first inert gas supply system mainly includes the first inert gas supply pipe 232f, the MFC 241f, and the valve 243f. The first inert gas supply system may also function as a purge gas supply system.

A mass flow controller (MFC) 241b serving as a flow rate controller (i.e., a flow rate control unit) and a valve 243b serving as an opening/closing valve are sequentially installed in the second gas supply pipe 232b from an upstream side. A second inert gas supply pipe 232g is connected to the second gas supply pipe 232b at a more downstream side of the valve 243b. A mass flow controller (MFC) 241g serving as a flow rate controller (i.e., a flow rate control unit) and a valve 243g serving as an opening/closing valve are sequentially installed in the second inert gas supply pipe 232g from an upstream side. In addition, the above-described second nozzle 249b is connected to an end of the second gas supply pipe 232b. The second nozzle 249b is installed in an arc-shaped space between the inner wall of the reaction tube 203 and the wafers 200 such that the second nozzle 249b extends upward in the stacked direction of the wafers 200 from a lower portion of the inner wall of the reaction tube 203 to an upper portion thereof. Specifically, the second nozzle 249b is installed along the wafer arrangement region where the wafers 200 are arranged, and in a region that horizontally surrounds the wafer arrangement region at a side of the wafer arrangement region. The second nozzle 249b is configured as an L-shaped nozzle, and its horizontal portion is installed to penetrate a lower sidewall of the reaction tube 203 while its vertical portion is installed to ascend at least from one end portion to the other end portion of the wafer arrangement region. A gas supply hole 250b for supplying gas is installed on a side surface of the second nozzle 249b. The gas supply hole 250b is opened toward the center of the reaction tube 203 to allow the gas to be supplied toward the wafers 200. A plurality of gas supply holes 250b is installed at a predetermined opening pitch from a lower portion to an upper portion of the reaction tube 203. An opening area for each of the gas supply holes 250b may be the same.

A second gas supply system mainly includes the second gas supply pipe 232b, the MFC 241b, and the valve 243b. The second gas supply system may also include the second nozzle 249b. In addition, a second inert gas supply system mainly includes the second inert gas supply pipe 232g, the MFC 241g, and the valve 243g. The second inert gas supply system may also function as a purge gas supply system.

A mass flow controller (MFC) 241c serving as a flow rate controller (i.e., a flow rate control unit) and a valve 243c serving as an opening/closing valve are sequentially installed in the third gas supply pipe 232c from an upstream side. A third inert gas supply pipe 232h is connected to the third gas supply pipe 232c at a more downstream side of the valve 243c. A mass flow controller (MFC) 241h serving as a flow rate controller (i.e., a flow rate control unit) and a valve 243h serving as an opening/closing valve are sequentially installed in the third inert gas supply pipe 232h from an upstream side. In addition, the third nozzle 249c described above is connected to an end of the third gas supply pipe 232c. The third nozzle 249c is installed in a buffer chamber 237 serving as a gas dispersion space.

The buffer chamber 237 is installed along the stacked direction of the wafers 200 in an arc-shaped space between the inner wall of the reaction tube 203 and the wafers 200, and in a region spanning from a lower portion of the reaction tube to an upper portion thereof. Thus, the buffer chamber 237 is installed along the wafer arrangement region, and in a region that horizontally surrounds the wafer arrangement region at a side of the wafer arrangement region. A gas supply hole 250e for supplying gas is installed at an end portion in a wall of the buffer chamber 237 adjacent to the wafers 200. The gas supply hole 250e is opened toward a center of the reaction tube 203 to allow the gas to be supplied to the wafers 200. A plurality of gas supply holes 250e is installed at a predetermined opening pitch from a lower portion to an upper portion of the reaction tube 203. An opening area for each of the gas supply holes 250e may be the same.

The third nozzle 249c is installed at an end portion of the buffer chamber 237, which is opposite to the end portion where the gas supply holes 250e are formed, to ascend upward in the stacked direction of the wafers 200 toward an upper portion from a lower portion of the inner wall of the reaction tube 203. Thus, the third nozzle 249c is installed along the wafer arrangement region where the wafers 200 are arranged, and in a region that horizontally surrounds the wafer arrangement region at a side of the wafer arrangement region. The third nozzle 249c is configured as an L-shaped nozzle, and its horizontal portion is installed to penetrate a lower sidewall of the reaction tube 203 while its vertical portion is installed to ascend at least from one end portion to the other end portion of the wafer arrangement region. A gas supply hole 250c for supplying gas is installed at a side surface of the third nozzle 249c. The gas supply holes 250c is opened toward a center of the buffer chamber 237. Similar to the gas supply holes 250e of the buffer chamber 237, a plurality of gas supply holes 250c is installed from a lower portion to an upper portion of the reaction tube 203. When a pressure difference between an interior of the buffer chamber 237 and an interior of the process chamber 201 is small, the plurality of the gas supply holes 250c may be configured to have a constant opening area and a constant opening pitch from an upstream side (i.e., a lower portion) to a downstream side (i.e., an upper portion). In contrast, when the pressure difference is large, the opening area may become larger and the opening pitch may become smaller in a direction from the upstream side to the downstream side.

In the present embodiment, by adjusting the opening area or the opening pitch of each of the gas supply holes 250c in the third nozzle 249c from the upstream side to the downstream side as described above, the gas is flown out from the individual gas supply holes 250c at an almost constant flow rate although a flow velocity for each of the gas supply holes 250c may be different. The gas flown out from the individual gas supply holes 250c is introduced into the buffer chamber 237 and the flow velocity of the gas then becomes uniform within the buffer chamber 237. In this case, particle velocities of the gas flown out from the individual gas supply holes 250c of the third nozzle 249c into the buffer chamber 237 are mitigated within the buffer chamber 237, and the gas is then flown out from the individual gas supply holes 250e of the buffer chamber 237 into the process chamber 201. Thus, the gas which has been flown out from the individual gas supply holes 250c of the third nozzle 249c into the buffer chamber 237 can have a substantially uniform flow rate and a substantially uniform flow velocity when it is flown out from the individual gas supply holes 250e of the buffer chamber 237 into the process chamber 201.

A third gas supply system mainly includes the third gas supply pipe 232c, the MFC 241c, and the valve 243c. The third gas supply system may also include the third nozzle 249c and the buffer chamber 237. In addition, a third inert gas supply system mainly includes a third inert gas supply pipe 232h, an MFC 241h, and a valve 243h. The third inert gas supply system may also function as a purge gas supply system.

A mass flow controller (MFC) 241d serving as a flow rate controller (i.e., a flow rate control unit) and a valve 243d serving as an opening valve are sequentially installed in the fourth gas supply pipe 232d from the upstream side. A fifth gas supply pipe 232e is connected to the fourth gas supply pipe 232d at a more downstream side of the valve 243d. A mass flow controller (MFC) 241e serving as a flow rate controller (i.e., a flow rate control unit) and a valve 243e serving as an opening/closing valve are sequentially installed in the fifth gas supply pipe 232e from an upstream side. Further, a fourth inert gas supply pipe 232i is connected to the fourth gas supply pipe 232d at a more downstream side of a connection position of the fourth gas supply pipe 232d and the fifth gas supply pipe 232e. A mass flow controller (MFC) 241i serving as a flow rate controller (i.e., a flow rate control unit) and a valve 243i serving as an opening/closing valve are installed in the fourth inert gas supply pipe 232i sequentially from an upstream side. Furthermore, the above-described fourth nozzle 249d is connected to an end of the fourth gas supply pipe 232d. The fourth nozzle 249d is installed in an arc-shaped space between the inner wall of the reaction tube 203 and the wafers 200 to ascend upward in the stacked direction of the wafers 200 from a lower portion of the inner wall of the reaction tube 203 to an upper portion thereof. Specifically, the fourth nozzle 249d is installed along the wafer arrangement region where the wafers 200 are arranged, and in a region that horizontally surrounds the wafer arrangement region at a side of the wafer arrangement region. The fourth nozzle 249d is configured as an L-shaped nozzle, and its horizontal portion is installed to penetrate a lower sidewall of the reaction tube 203 while its vertical portion is installed to ascend at least from one end portion to the other end portion of the wafer arrangement region. A gas supply hole 250d for supplying gas is installed on a side surface of the fourth nozzle 249d. The gas supply hole 250d is opened toward the center of the reaction tube 203 to allow the gas to be supplied to the wafers 200. A plurality of gas supply holes 250d is installed at a predetermined opening pitch from a lower portion to an upper portion of the reaction tube 203. An opening area for each of the gas supply holes 250d may be the same.

A fourth gas supply system mainly includes the fourth gas supply pipe 232d, the MFC 241d, and the valve 243d. The fourth gas supply system may also include the fourth nozzle 249d. In addition, a fifth gas supply system mainly includes the fifth gas supply pipe 232e, the MFC 241e, and the valve 243e. The fifth gas supply system may also include a portion of the fourth nozzle 249d at a more downstream side of the connection position of the fourth gas supply pipe 232d and the fifth gas supply pipe 232e. Furthermore, a fourth inert gas supply system mainly includes the fourth inert gas supply pipe 232i, the MFC 241i, and the valve 243i. The fourth inert gas supply system may also function as a purge gas supply system.

As described above, the gas supply method according to the present embodiment transfers gases through the nozzles 249a to 249d and the buffer chamber 237, which are arranged within the arc-shaped longitudinal space defined by the inner wall of the reaction tube 203 and end portions of the stacked wafers 200, and first supplies the gases from the gas supply holes 250a to 250e (which are opened in the nozzles 249a to 249d and the buffer chamber 237) into the reaction tube 203, near the wafers 200. Accordingly, the gases supplied into the reaction tube 203 mainly flow within the reaction tube 203 in a direction parallel to surfaces of the wafers 200, i.e., in a horizontal direction. According to the above configurations, the gases can be uniformly supplied to the wafers 200, thereby making a thickness of a thin film formed on each of the wafers 200 uniform. In addition, the gases flowing on the surfaces of the wafers 20 after reaction, i.e., residual gases, flow toward an exhaust port, i.e., the exhaust pipe 231, which will described later. However, the flow direction of the residual gases may be appropriately decided depending on a position of the exhaust port, and is not limited to a vertical direction.

A precursor gas containing a predetermined element and a halogen element, for example, a chlorosilane-based precursor gas as a precursor gas containing at least silicon (Si) and chlorine (Cl), is supplied from the first gas supply pipe 232a into the process chamber 201 through the MFC 241a, the valve 243a, and the first nozzle 249a. As used herein, the chlorosilane-based precursor gas is a chlorosilane-based precursor in a gaseous state, for example, a gas which is obtained by vaporizing a chlorosilane-based precursor in a liquid state under normal temperature (e.g., room temperature) and pressure, a chlorosilane-based precursor which is in a gaseous state under normal temperature and pressure, and the like. In addition, the chlorosilane-based precursor refers to a silane-based precursor having a chloro group as a halogen group, and also refers to a precursor containing at least Si and Cl. As such, the chlorosilane-based precursor may refer to a kind of halide. Further, as used herein, the term "precursor" may refer to "a liquid precursor in a liquid state," "a precursor gas in a gaseous state," or both of them. Therefore, as used herein, the term "chlorosilane-based precursor" may refer to "a chlorosilane-based precursor in a liquid state," "a chlorosilane-based precursor in a gaseous state," or both of them. For example, hexachlorodisilane ($Si_2Cl_6$, abbreviation: HCDS) may be used as the chlorosilane-based precursor. When a liquid precursor in a liquid state under normal temperature and pressure such as HCDS in a liquid state is used, the liquid precursor may be vaporized by a vaporizing system, such as a vaporizer, a bubbler, or the like, and supplied as the precursor gas (e.g., HCDS gas).

A reaction gas including a borazine compound, for example, a reaction gas including an alkylborazine compound which is an organic borazine compound, that is, an organic borazine-based gas (i.e., borazine-based gas) is supplied from the second gas supply pipe 232b into the process chamber 201 through the MFC 241b, the valve 243b, and the second nozzle 249b.

Figure 16A:
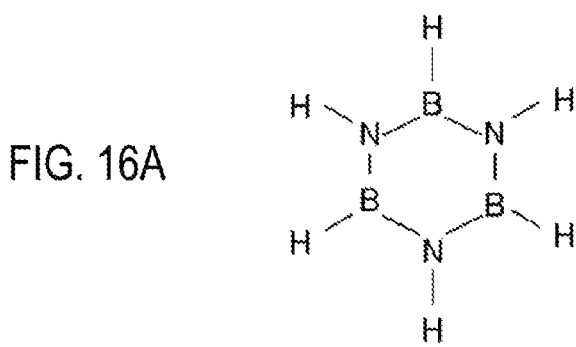
FIG. 16A illustrates a chemical structural formula of borazine.
Figure 16B:
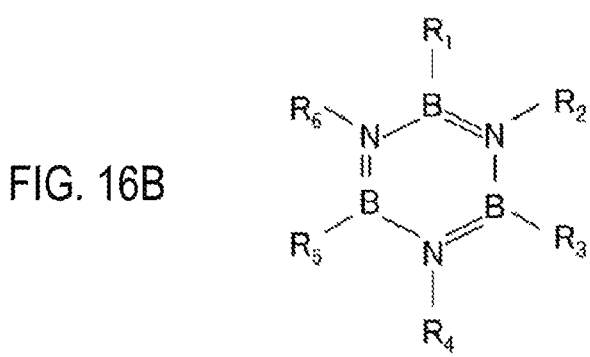
FIG. 16B illustrates a chemical structural formula of a borazine compound.

Here, borazine is a heterocyclic compound containing boron (B), nitrogen (N), and hydrogen (H). Borazine may be represented by a composition formula of $B_3H_6N_3$, and may be represented by a chemical structural formula shown in FIG. 16A. A borazine compound has a borazine ring skeleton (also referred to as a "borazine skeleton") constituting a borazine ring including three B atoms and three N atoms. An organic borazine compound is a borazine compound containing carbon (C) and may also be referred to as a borazine compound containing a C-containing ligand. An alkylborazine compound is a borazine compound containing an alkyl group and may be referred to as a borazine compound containing an alkyl group as a ligand. The alkylborazine compound is a compound in which at least any one of six hydrogen (H) atoms contained in the borazine compound is substituted with hydrocarbon containing one or more C atoms, and may be represented by a chemical structural formula shown in FIG. 16B. In this case, each of $R_1$ to $R_6$ in the chemical structural formula shown in FIG. 16B is a H atom or an alkyl group containing one to four C atoms. $R_1$ to $R_6$ may be the same alkyl group or may be different alkyl groups from each other. However, not all of $R_1$ to $R_6$ should be H. The alkylborazine compound may indicate a substance having a borazine ring skeleton constituting a borazine ring and containing B, N, H, and C. Also, the alkylborazine compound may indicate a substance having a borazine ring skeleton and containing an alkyl ligand. In addition, each of $R_1$ to $R_6$ may an H atom, or an alkenyl group or an alkynyl group containing one to four C atoms. $R_1$ to $R_6$ may be the same alkenyl group or alkynyl group, or may be different alkenyl groups or alkynyl groups from each other. However, not all of $R_1$ to $R_6$ should be H. The reaction gas including the organic borazine compound may be a boron-containing gas (boron precursor), a nitrogen-containing gas (nitrogen source), and a carbon-containing gas (carbon source).

Figure 16C:
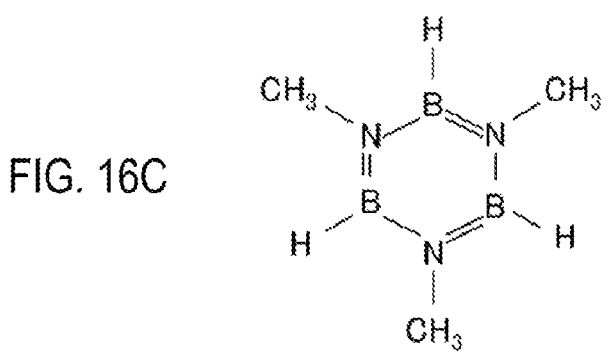
FIG. 16C illustrates a chemical structural formula of n,n', n"-trimethylborazine.

For example, n,n',n''-trimethylborazine (abbreviation: TMB) gas may be used as the reaction gas including the organic borazine compound. TMB may be represented by a chemical structural formula shown in FIG. 16C in which $R_1$, $R_3$, and $R_5$ of the chemical structural formula in FIG. 16B are H atoms while $R_2$, $R_4$, and $R_6$ of the chemical structural formula in FIG. 16B are methyl groups (—$CH_3$). TMB may also be referred to as a borazine compound having a borazine ring skeleton and containing a methyl group as a ligand. In the case of using an organic borazine compound such as TMB which is in a liquid state under normal temperature and pressure, the organic borazine compound in a liquid state may be vaporized by a vaporization system such as a vaporizer or a bubbler to be supplied as the reaction gas including an organic borazine compound (e.g., TMB gas). Further, the reaction gas including an organic borazine compound may be simply referred to as an organic borazine compound gas.

A nitriding gas (i.e., nitrogen-containing gas) is supplied from the third gas supply pipe 232c into the process chamber 201 through the MFC 241c, the valve 243c, the third nozzle 249c, and the buffer chamber 237. For example, ammonia ($NH_3$) gas may be used as the nitriding gas.

A gas containing carbon (C) (i.e., carbon-containing gas) which is a carbon source, for example, a hydrocarbon gas, is supplied from the fourth gas supply pipe 232d into the process chamber 201 through the MFC 241d, the valve 243d, and the fourth nozzle 249d. Propylene ($C_3H_6$) gas may be used as the carbon-containing gas.

A gas containing nitrogen (N) and carbon (C), for example, an amine-based gas, is supplied from the fifth gas supply pipe 232e into the process chamber 201 through the MFC 241e, the valve 243e, the fourth gas supply pipe 232d, and the fourth nozzle 249d. In this example, the amine-based gas may be a gas containing an amine group such as amine in a gaseous state, for example, a gas which is obtained by vaporizing amine in a liquid state under normal temperature and pressure, or amine which is in a gaseous state under normal temperature and pressure. The amine-based gas contains amine such as ethylamine, methylamine, propylamine, isopropylamine, butylamine, isobutylamine, and the like. As used herein, the term "amine" is a generic name of compounds in which a hydrogen atom in ammonia ($NH_3$) is substituted with a hydrocarbon group such as an alkyl group. As such, amine contains a hydrocarbon group such as an alkyl group as a ligand containing C atoms. Since the amine-based gas contains three elements of C, N, and H while not containing Si, it may be referred to as a Si-free gas. Further, since the amine-based gas does not contain Si and metal, it may be referred to as a Si-free and metal-free gas. Further, the amine-based gas may be a nitrogen-containing gas (i.e., nitrogen source), a carbon-containing gas (i.e., carbon source), and a hydrogen-containing gas. The amine-based gas may be a gas only containing three elements of C, N, and H that constitute an amine group. As used herein, the term "amine" may refer to "amine in a liquid state," "an amine-based gas in a gaseous state," or both of them. For example, triethylamine (($C_2H_5$)$_3$N, abbreviation: TEA) gas can be used as the amine-based gas. When amine in a liquid state under normal temperature and pressure such as TEA in a liquid state is used, the amine in the liquid state may be vaporized by a vaporization system, such as a vaporizer, a bubbler, or the like, and supplied as the gas containing N and C (e.g., TEA gas).

For example, nitrogen ($N_2$) gas is supplied as an inert gas from each of the inert gas supply pipes 232f to 232i into the process chamber 201 through the MFCs 241f to 241i, the valves 243f to 243i, the gas supply pipes 232a to 232d, the nozzles 249a to 249d, and the buffer chamber 237.

When the above-mentioned gases flow from the gas supply pipes, respectively, the first gas supply system is configured as a precursor gas supply system that supplies the precursor gas containing a predetermined element and a halogen element, e.g., a chlorosilane-based precursor gas supply system. The chlorosilane-based precursor gas supply system may also be simply referred to as a chlorosilane-based precursor supply system. The second gas supply system is configured as a reaction gas supply system that supplies the reaction gas including an organic borazine compound, e.g., an organic borazine-based gas (or borazine-based gas) supply system. Further, the reaction gas supply system may also be referred to as an organic borazine compound gas supply system. The third gas supply system is configured as a nitriding gas (or nitrogen-containing gas) supply system. The fourth gas supply system is configured as a hydrocarbon-based gas supply system serving as a carbon-containing gas supply system. The fifth gas supply system is configured as an amine-based gas supply system serving as a nitrogen-and-carbon-containing gas supply system.

In the buffer chamber 237, as illustrated in FIG. 2, a first rod-shaped electrode 269 serving as a first electrode that has an elongated structure and a second rod-shaped electrode 270 serving as a second electrode that has an elongated structure are installed from a lower portion to an upper portion of the reaction tube 203 in the direction of the stacked wafers 200. Each of the first rod-shaped electrode 269 and the second rod-shaped electrode 270 is installed in parallel to the third nozzle 249c. Each of the first rod-shaped electrode 269 and the second rod-shaped electrode 270 is covered with and protected by an electrode protection tube 275, which is a protection tube for protecting each electrode from an upper portion to a lower portion thereof. One of the first rod-shaped electrode 269 and the second rod-shaped electrode 270 is connected to a high-frequency power supply 273 via a matching unit 272, and the other one of them is connected to a ground corresponding to a reference electric potential. By applying a high-frequency power from the high-frequency power supply 273 between the first rod-shaped electrode 269 and the second rod-shaped electrode 270 via the matching unit 272, plasma is generated in a plasma generation region 224 which is between the first rod-shaped electrode 269 and the second rod-shaped electrode 270. A plasma source as a plasma generator (or plasma generating unit) mainly includes the first rod-shaped electrode 269, the second rod-shaped electrode 270, and the electrode protection tubes 275. The plasma source may also include the matching unit 272 and the high-frequency power supply 273. Also, as described later, the plasma source functions as an activating mechanism (or exciting unit) that activates (or excites) the gas by plasma.

Each of the electrode protection tubes 275 has a structure in which either the first rod-shaped electrode 269 or the second rod-shaped electrode 270 can be inserted into the buffer chamber 237 in a state where the inserted rod-shaped electrode is isolated from an internal atmosphere of the buffer chamber 237. In this case, when internal oxygen concentrations in the electrode protection tubes 275 are equal to an oxygen concentration in an ambient air (atmosphere), the first rod-shaped electrode 269 and the second rod-shaped electrode 270 inserted into the electrode protection tubes 275 are oxidized by the heat generated by the heater 207. Therefore, by charging the inside of the electrode protection tube 275 with an inert gas such as nitrogen gas, or by purging the inside of the electrode protection tube 275 with an inert gas such as nitrogen gas using an inert gas purging mechanism, the internal oxygen concentrations of the electrode protection tubes 275 decrease and thus, oxidation of the first rod-shaped electrode 269 and the second rod-shaped electrode 270 can be prevented.

The exhaust pipe 231 for exhausting an internal atmosphere of the process chamber 201 is installed at the reaction tube 203. A vacuum-exhaust device, for example, a vacuum pump 246, is connected to the exhaust pipe 231 via a pressure sensor 245, which is a pressure detector (i.e., pressure detecting unit) for detecting an internal pressure of the process chamber 201, and an auto pressure controller (APC) valve 244, which is a pressure adjuster (i.e., pressure adjusting unit). The APC valve 244 is configured to perform/stop vacuum-exhaust in the process chamber 201 by opening/closing the valve with the actuated vacuum pump 246, and further to adjust the internal pressure of the process chamber 201 by adjusting a degree of the valve opening with the actuated vacuum pump 246. An exhaust system mainly includes the exhaust pipe 231, the APC valve 244, and the pressure sensor 245. Also, the exhaust system may also include the vacuum pump 246. The exhaust system is configured to adjust the degree of the valve opening of the APC valve 244 based on pressure information detected by the pressure sensor 245 while operating the vacuum pump 246 such that the internal pressure of the process chamber 201 is vacuum-exhausted to a predetermined pressure (or vacuum level).

A seal cap 219, which functions as a furnace port cover configured to hermetically seal a lower end opening of the reaction tube 203, is installed under the reaction tube 203. The seal cap 219 is configured to contact the lower end portion of the reaction tube 203 from its bottom in a vertical direction. The seal cap 219, for example, may be formed of metal such as stainless steel and have a disc shape. An O-ring 220 is installed at an upper surface of the seal cap 219 to be configured as a seal member in contact with the lower end portion of the reaction tube 203. A rotation mechanism 267 configured to rotate the boat 217, which is a substrate holder to be described later, is installed below the seal cap 219. A rotary shaft 255 of the rotation mechanism 267 passes through the seal cap 219 to be connected to the boat 217. The rotation mechanism 267 is configured to rotate the wafers 200 by rotating the boat 217. The seal cap 219 is configured to be vertically elevated or lowered by a boat elevator 115, which is an elevation mechanism vertically installed at the outside of the reaction tube 203. The boat elevator 115 is configured to enable the boat 217 to be loaded into or unloaded from the process chamber 201 by elevating or lowering the seal cap 219. As such, the boat elevator 115 is configured as a transfer device (i.e., transfer mechanism) that transfers the boat 217, ultimately, the wafers 200, into and out of the process chamber 201.

The boat 217, which is used as a substrate support, is made of a heat resistant material such as quartz, silicon carbide, and the like and is configured to support the plurality of wafers 200 horizontally stacked in multiple stages with the centers of the wafers 200 concentrically aligned. In addition, a heat insulating member 218 formed of a heat resistant material such as quartz, silicon carbide, and the like is installed at a lower portion of the boat 217 and configured such that the heat from the heater 207 cannot be transferred to the seal cap 219. Further, the heat insulating member 218 may include a plurality of heat insulating plates formed of a heat resistant material such as quartz, silicon carbide, and the like, and a heat insulating plate holder configured to support the heat insulating plates in a horizontal posture in a multi-stage manner.

A temperature sensor 263, which is a temperature detector, is installed in the reaction tube 203. Based on temperature information detected by the temperature sensor 263, an electric conduction state to the heater 207 is adjusted such that an interior of the process chamber 201 has a desired temperature distribution. The temperature sensor 263 is configured in an L-shape similar to the nozzles 249a to 249d and is installed along the inner wall of the reaction tube 203.

Figure 3:
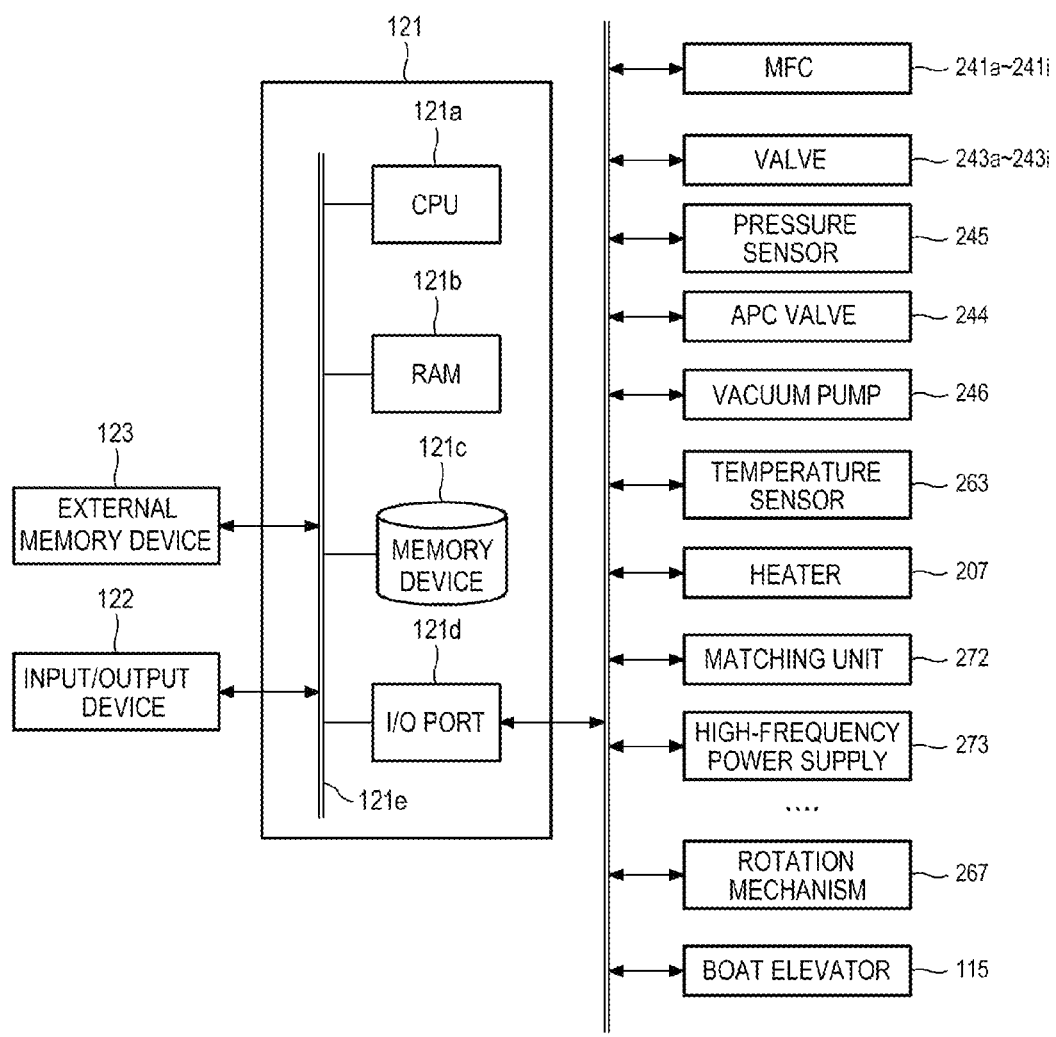
FIG. 3 schematically illustrates a configuration of a controller of the substrate processing apparatus appropriately employed in one embodiment of the present disclosure, in which a control system of the controller is shown by a block diagram.

As illustrated in FIG. 3, a controller 121, which is a control unit (or a control part), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122, for example, including a touch panel or the like, is connected to the controller 121.

The memory device 121c is configured with, for example, a flash memory, a hard disc drive (HDD), or the like. A control program for controlling operations of the substrate processing apparatus or a process recipe, in which a sequence or condition for processing a substrate described later is written, is readably stored in the memory device 121c. Also, the process recipe functions as a program for the controller 121 to execute each sequence in the substrate processing process, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (or a work area) in which a program or data read by the CPU 121a is temporarily stored.

The I/O port 121d is connected to the MFC 241a to 241i, the valves 243a to 243i, the pressure sensor 245, the APC valve 244, the vacuum pump 246, the heater 207, the temperature sensor 263, the high-frequency power supply 273, the matching unit 272, the rotation mechanism 267, the boat elevator 115 and the like.

The CPU 121a is configured to read and execute the control program from the memory device 121c. The CPU 121a also reads the process recipe from the memory device 121c according to an input of an operation command from the input/output device 122. In addition, the CPU 121a is configured to control flow rates for controlling operations of various types of gases by the MFCs 241a to 241i, the opening/closing operation of the valves 243a to 243i, the opening/closing operation of the APC valve 244, the pressure adjusting operation by the APC valve 244 based on the pressure sensor 245, the operation of starting and stopping the vacuum pump 246, the temperature adjusting operation of the heater 207 based on the temperature sensor 263, the operation of supplying power by the high-frequency power supply 273, the impedance adjusting operation of the matching unit 272, the rotation and rotation speed adjusting operation of the boat 217 by the rotation mechanism 267, the elevation operation of the boat 217 by the boat elevator 115, and the like, according to contents of the read process recipe.

Moreover, the controller 121 is not limited to being configured as a dedicated computer but may be configured as a general-purpose computer. For example, the controller 121 according to one embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for supplying a program to a computer is not limited to the case in which the program is supplied through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as "a recording medium." In addition, when the term "recording medium" is used herein, it may include a case of including only the memory device 121c, a case of including only the external memory device 123, or a case of including both the memory device 121c and the external memory device 123.

(2) Substrate Processing

Hereinafter, examples of a sequence of forming a thin film on a substrate, which is a part of the processes of manufacturing a semiconductor device by using the processing furnace 202 of the above-described substrate processing apparatus (or device), will be described. In addition, in the following descriptions, operations of the respective units constituting the substrate processing apparatus are controlled by the controller 121.

In the film forming sequence of the present embodiment, a thin film having a borazine ring skeleton and containing a predetermined element, B, C, and N is formed on a substrate by performing a cycle a predetermined number of times. The cycle includes: supplying a precursor gas containing the predetermined element and a halogen element to a substrate; supplying a reaction gas including an organic borazine compound to the substrate; and supplying a carbon-containing gas to the substrate. The cycle is performed under a condition in which the borazine ring skeleton in the organic borazine compound is maintained.

As described above, the cycle including supplying the precursor gas and supplying the reaction gas is performed the predetermined number of times. In this case, in at least one of supplying the precursor gas and supplying the reaction gas (for example, in supplying the reaction gas), supplying a carbon-containing gas to the substrate may be performed.

Further, the phrase "performing a cycle a predetermined number of times, the cycle including supplying a precursor gas and supplying a reaction gas" may mean that a cycle in which supplying the precursor gas and supplying the reaction gas are alternately or simultaneously performed is set as one cycle and the cycle is performed one or more times. As such, the phrase may mean that the cycle is performed one or more times. In other words, the phrase may also mean that a cycle in which supplying the precursor gas and supplying the reaction gas are alternately or simultaneously performed is performed once or repeated a plurality of times. However, it may be preferred that the cycle is repeated a plurality of times.

Furthermore, the phrase "in at least one of supplying a precursor gas and supplying a reaction gas, supplying a carbon-containing gas to the substrate is performed" may mean that within at least one of processes of supplying the precursor gas and supplying the reaction gas, the process of supplying the carbon-containing gas is performed in at least a portion of a period in which the precursor gas or the reaction gas is supplied, performed in a period in which the supply of the precursor gas or the reaction gas is halted (i.e., a period before starting the supply and/or a period after halting the supply), or performed in both the periods.

Figure 5A:
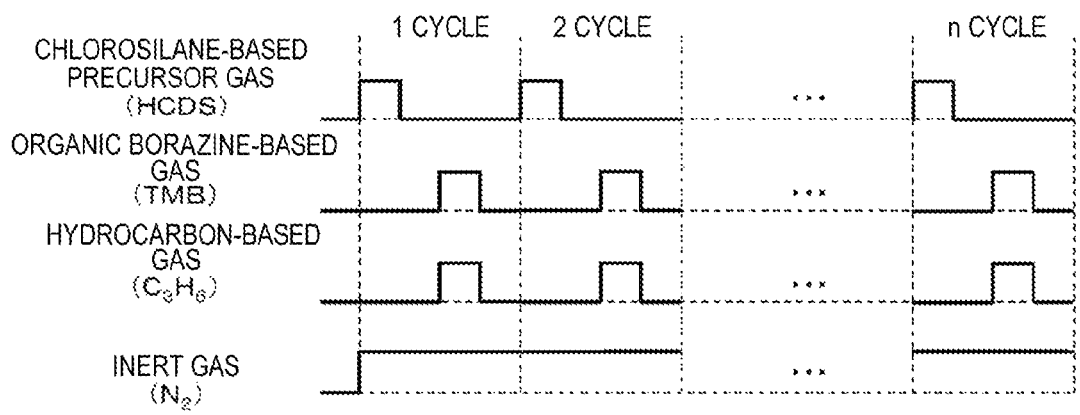
FIG. 5A illustrates a timing diagram for supplying gases in the film forming sequence according to the first embodiment of the present disclosure.

Hereinafter, the film forming sequence of the present embodiment is described in detail. FIG. 4 illustrates a flowchart of a method for film forming in the film forming sequence according to the present embodiment. FIG. 5A is illustrates a timing diagram for supplying gases in the film forming sequence according to the present embodiment.

In the film forming sequence illustrated in FIGS. 4A and 5, a thin film having a borazine ring skeleton and containing Si, B, C, and N (hereinafter, which may also be referred to as a SiBCN film having a borazine ring skeleton) is formed on the wafer 200 by performing a cycle a predetermined number of times. The cycle includes: supplying the HCDS gas as a chlorosilane-based precursor gas containing Si and Cl to the wafer 200; and supplying the TMB gas as a reaction gas including an organic borazine compound to the wafer 200. Here, the cycle is performed under a condition in which the borazine ring skeleton in the organic borazine compound is maintained. In the following descriptions, for convenience, the SiBCN film having the borazine ring skeleton may be simply referred to as a SiBCN film.

Here, supplying the HCDS gas and supplying the TMB gas may be alternately performed a predetermined number of times. In this case, supplying the $C_3H_6$ gas as a carbon-containing gas to the wafer 200 may be performed within a process of supplying the TMB gas. Further, the process of supplying the $C_3H_6$ gas may be performed in a period in which the TMB gas is supplied within the process of supplying the TMB gas. As such, the TMB gas and the $C_3H_6$ gas may be supplied to the wafer 200 simultaneously.

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (or an exposed surface) of a wafer itself" or "a surface of a predetermined layer or film formed on a wafer, i.e., an uppermost surface of the wafer, which is a laminated body."

As such, as used herein, the phrase "a predetermined gas is supplied to a wafer" may mean that "a predetermined gas is directly supplied to a surface (or an exposed surface) of a wafer itself" or that "a predetermined gas is supplied to a layer or a film formed on a wafer, i.e., on an uppermost surface of a wafer as a laminated body." Also, as used herein, the phrase "a predetermined layer (or film) is formed on a wafer" may mean that "a predetermined layer (or film) is directly formed on a surface (or an exposed surface) of a wafer itself" or that "a predetermined layer (or film) is formed on a layer or a film formed on a wafer, i.e., on an uppermost surface of a wafer as a laminated body."

In addition, the term "substrate" as used herein may be synonymous with the term "wafer" and, in this case, the terms "wafer" and "substrate" may be used interchangeably in the above descriptions.

(Wafer Charge and Boat Load)

When the plurality of wafers 200 is charged on the boat 217 (i.e., wafer charge), as illustrated in FIG. 1, the boat 217 supporting the plurality of wafers 200 is lifted by the boat elevator 115 and is loaded into the process chamber 201 (i.e., boat load). In this state, the seal cap 219 seals the lower end of the reaction tube 203 via the O-ring 220.

(Pressure Adjustment and Temperature Adjustment)

The interior of the process chamber 201, that is, a space in which the wafers 200 exist is vacuum-exhausted to a desired pressure (or a desired vacuum level). In this case, the internal pressure of the process chamber 201 is measured by the pressure sensor 245. The APC valve 244 is feedback-controlled based on the measured pressure information (i.e., pressure adjustment). The vacuum pump 246 may be continuously operated at least until the processing on the wafers 200 is completed. The wafers 200 in the process chamber 201 are heated by the heater 207 to a desired temperature. In this case, the state of supplying an electric current to the heater 207 is feedback-controlled based on the temperature information detected by the temperature sensor 263 such that the interior of the process chamber 201 reaches a desired temperature distribution (i.e., temperature adjustment). In addition, the heating of the interior of the process chamber 201 by the heater 207 may be continuously performed at least until processing on the wafers 200 is completed. Subsequently, the boat 217 and the wafer 200 begin to be rotated by the rotation mechanism 267. Furthermore, the rotation of the boat 217 and wafers 200 by the rotation mechanism 267 may be continuously performed at least until the processing on the wafers 200 is completed.

(Process of Forming SiBCN Film)

Next, following two steps, i.e., Steps 1 and 2, are sequentially performed.

[Step 1a]

(HCDS Gas Supply)

The valve 243a of the first gas supply pipe 232a is opened to flow the HCDS gas into the first gas supply pipe 232a. A flow rate of the HCDS gas flowing in the first gas supply pipe 232a is adjusted by the MFC 241a. The flow rate-adjusted HCDS gas is supplied from the gas supply holes 250a of the first nozzle 249a into the process chamber 201, and is exhausted through the exhaust pipe 231. As such, the HCDS gas is supplied to the wafers 200 (i.e., HCDS gas supply). In this case, the valve 243f is opened to flow an inert gas such as $N_2$ gas into the first inert gas supply pipe 232f. A flow rate of the $N_2$ gas flowing in the first inert gas supply pipe 232f is adjusted by the MFC 241f. The flow rate-adjusted $N_2$ gas is supplied into the process chamber 201 together with the HCDS gas, and is exhausted through the exhaust pipe 231.

During this operation, in order to prevent infiltration of the HCDS gas into the second nozzle 249b, the third nozzle 249c, the fourth nozzle 249d, and the buffer chamber 237, the valves 243g, 243h, and 243i are opened to flow the $N_2$ gas into the second inert gas supply pipe 232g, the third inert gas supply pipe 232h, and the fourth inert gas supply pipe 232i. The $N_2$ gas is supplied into the process chamber 201 through the second gas supply pipe 232b, the third gas supply pipe 232c, the fourth gas supply pipe 232d, the second nozzle 249b, the third nozzle 249c, the fourth nozzle 249d, and the buffer chamber 237, and is exhausted through the exhaust pipe 231.

In this case, the APC valve 244 is appropriately adjusted such that the internal pressure of the process chamber 201 falls within a range of, for example, 1 to 13,300 Pa, specifically, 20 to 1,330 Pa. The supply flow rate of the HCDS gas controlled by the MFC 241a is set to fall within a range of, for example, 1 to 1,000 sccm. The supply flow rate of the $N_2$ gas controlled by the MFC 241a is set to fall within a range of, for example, 1 to 1,000 sccm. The supply flow rate of the $N_2$ gas controlled by each of the MFCs 241f to 241f is set to fall within a range of, for example, 100 to 10,000 sccm. A time for supplying the HCDS gas to the wafer 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within a range of, for example, 250 to 700 degrees C., specifically, 300 to 650 degrees C., more specifically, 350 to 600 degrees C. When the temperature of the wafer 200 falls within less than 250 degrees C., HCDS is hardly chemically adsorbed onto the wafers 200. This may sometimes make it impossible to obtain a practical film forming rate. This problem can be solved by setting the temperature of the wafers 200 to be equal to or higher than 250 degrees. Further, HCDS can more sufficiently be adsorbed onto the wafers 200 and a more sufficient film forming rate can be obtained by setting the temperature of the wafers 200 equal to or higher than 300 degrees C., or equal to or higher than 350 degrees C. When the temperature of the wafers 200 exceeds 700 degrees C., a CVD reaction becomes intensive (in other words, a gas phase reaction becomes dominant). Thus, the film thickness uniformity may be hard to control and often deteriorates. By setting the temperature of the wafers 200 equal to or lower than 700 degrees C., such deterioration of the film thickness uniformity can be suppressed and thus, it becomes possible to control the film thickness uniformity. In particular, a surface reaction becomes dominant by setting the temperature of the wafers 200, for example, equal to or lower than 650 degrees C., specifically, equal to or lower than 600 degrees C., and thus, it becomes easy to secure and control uniformity of the film thickness. Accordingly, the temperature of the wafers 200 may be set to fall within, for example, a range of 250 to 700 degrees C., specifically, 300 to 650 degrees C., more specifically, 350 to 600 degrees C.

By supplying the HCDS gas to the wafers 200 under the above conditions, a Si-containing layer containing Cl having a thickness, for example, from less than one atomic layer to several atomic layers is formed on the wafer 200 (or a base film of its surface), as a first layer. The silicon-containing layer containing Cl may be an adsorption layer of the HCDS gas, a silicon layer containing Cl, or both of them.

Here, the phrase "silicon layer containing Cl" is a generic name which encompasses a continuous or discontinuous layer that is formed of Si and contains Cl, and a Si thin film containing Cl that is formed by laminating such layers. The continuous layer that is formed of Si and contains Cl may be referred to as a silicon thin film containing Cl. In addition, Si constituting the silicon layer containing Cl includes Si whose bond to Cl is completely broken, in addition to Si whose bond to Cl is not completely broken.

The adsorption layer of the HCDS gas includes a continuous chemical adsorption layer in which gas molecules of the HCDS gas are continuous, and a discontinuous chemical adsorption layer in which gas molecules of the HCDS gas are discontinuous. In other words, the adsorption layer of the HCDS gas may include a chemical adsorption layer formed of HCDS molecules and having a thickness of one molecular layer or less than one molecular layer. HCDS ($Si_2Cl_6$) molecules that constitute the adsorption layer of the HCDS gas include one or more molecules in which a bond between Si and Cl is partially broken (e.g., $Si_xCl_y$ molecules).

A layer having a thickness of less than one atomic layer refers to a discontinuously formed atomic layer. A layer having a thickness of one atomic layer refers to a continuously formed atomic layer. In addition, a layer having a thickness of less than one molecular layer refers to a discontinuously formed molecular layer. A layer having a thickness of one molecular layer refers to a continuously formed molecular layer.

Under a condition in which the HCDS gas is autolyzed (or pyrolyzed), i.e., under a condition in which a pyrolysis reaction of the HCDS gas occurs, Si is deposited on the wafer 200 to form the Si layer containing Cl. Under a condition in which the HCDS gas is not autolyzed (or pyrolyzed), i.e., under a condition in which a pyrolysis reaction of the HCDS gas does not occur, the HCDS gas is adsorbed on the wafer 200 to form the adsorption layer of the HCDS gas. In addition, a film forming rate when the Si layer containing Cl is formed on the wafer 200 may be greater than that when the adsorption layer of the HCDS gas is formed on the wafer 200.

When the thickness of the Si-containing layer containing Cl formed on the wafer 200 exceeds several atomic layers, an effect of a modification reaction in following Steps 2a, which will be described later, is not to be applied to the entire Si-containing layer containing Cl. On the other hand, a minimum value of the thickness of the Si-containing layer containing Cl that can be formed on the wafer 200 is less than one atomic layer. Accordingly, the thickness of the Si-containing layer containing Cl may range from less than one atomic layer to several atomic layers. In addition, when the thickness of the Si-containing layer containing Cl is set to be one atomic layer or less (i.e., one atomic layer or less than one atomic layer), the effect of the modification reaction in Steps 2a which will be described later can be relatively increased. This makes it possible to shorten a time required for the modification reaction in Steps 2a. It is also possible to shorten a time required for forming the Si-containing layer containing Cl in Step 1a. As a result, a processing time per cycle can be reduced and hence a total processing time can be shortened. As such, the film forming rate can be increased. In addition, if the thickness of the Si-containing layer containing Cl is one atomic layer or less, it becomes possible to better control of film thickness uniformity.

(Residual Gas Removal)

After the first layer is formed, the valve 243a of the first gas supply pipe 232a is closed to stop the supply of the HCDS gas. At this time, while the APC valve 244 of the exhaust pipe 231 is in an open state, the interior of the process chamber 201 is vacuum-exhausted by the vacuum pump 246 to remove from the process chamber 201 the HCDS gas, which has not reacted or remains after contributing to the formation of the first layer, remaining in the process chamber 201 (i.e., residual gas removal). In this operation, the supply of the $N_2$ gas as an inert gas into the process chamber 201 is maintained by keeping the valves 243f to 243i in an open state. The $N_2$ gas acts as a purge gas so as to enhance the effect of removing from the process chamber 201 the HCDS gas, which has not reacted or remains after contributing to the formation of the first layer, remaining in the process chamber 201.

In this case, the gas remaining in the process chamber 201 may incompletely be removed and the interior of the process chamber 201 may incompletely be purged. When the gas remaining in the process chamber 201 is very small in amount, there is no adverse effect to be generated in following Step 2a. Here, an amount of the $N_2$ gas supplied into the process chamber 201 need not be a large amount. For example, approximately the same amount of the $N_2$ gas as the volume of the reaction tube 203 (or the process chamber 201) may be supplied to perform the purging such that there is no adverse effect to be generated in Step 2a. As described above, as the interior of the process chamber 201 is incompletely purged, the purge time can be reduced and thus the throughput can be improved. In addition, the consumption of the $N_2$ gas can also be suppressed to a minimal necessity.

Examples of the chlorosilane-based precursor gas may include inorganic precursor gases such as tetrachlorosilane, i.e., silicon tetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, monochlorosilane ($SiH_3Cl$, abbreviation: MCS) gas and the like, in addition to the hexachlorodisilane ($Si_2Cl_6$, abbreviation: HCDS) gas. Examples of the inert gas may include rare gases such as Ar gas, He gas, Ne gas, Xe gas and the like, in addition to the $N_2$ gas.

[Step 2a]

(TMB Gas and $C_3H_6$ Gas Supply)

After Step 1a is completed by removing the residual gas from the process chamber 201, the valve 243b of the second gas supply pipe 232b is opened to flow the TMB gas into the second gas supply pipe 232b. A flow rate of the TMB gas flowing in the second gas supply pipe 232b is adjusted by the MFC 241b. The flow rate-adjusted TMB gas is supplied from the gas supply holes 250b of the second nozzle 249b into the process chamber 201 and exhausted through the exhaust pipe 231. In this case, the valve 243g is opened to flow the $N_2$ gas as an inert gas into the second inert gas supply pipe 232g. A flow rate of the $N_2$ gas flowing in the second inert gas supply pipe 232g is adjusted by the MFC 241g. The flow-rate adjusted $N_2$ gas is supplied into the process chamber 201, together with the TMB gas.

Simultaneously, the valve 243d of the fourth gas supply pipe 232d is opened to flow the $C_3H_6$ gas into the fourth gas supply pipe 232d. A flow rate of the $C_3H_6$ gas flowing in the fourth gas supply pipe 232d is adjusted by the MFC 241d. The flow rate-adjusted $C_3H_6$ gas is supplied from the gas supply holes 250d of the fourth nozzle 249d into the process chamber 201. In this case, the valve 243i is opened to flow the $N_2$ gas as an inert gas into the fourth inert gas supply pipe 232i. The flow rate of the $N_2$ gas flowing in the fourth inert gas supply pipe 232i is adjusted by the MFC 241i. The flow-rate adjusted $N_2$ gas is supplied into the process chamber 201, together with the $C_3H_6$ gas.

Each of the TMB gas and the $C_3H_6$ gas supplied into the process chamber 201 is excited (or activated) by heat and exhausted through the exhaust pipe 231, together with the $N_2$ gas supplied from the second inert gas supply pipe 232g and the fourth inert gas supply pipe 232i. In this embodiment, the TMB gas and the $C_3H_6$ gas activated by heat are simultaneously supplied onto the wafers 200.

During the above operation, in order to prevent infiltration of the TMB gas and the $C_3H_6$ gas into the first nozzle 249a, the third nozzle 249c, and the buffer chamber 237, the valves 243f and 243h are opened to flow the $N_2$ gas into the first inert gas supply pipe 232f and the third inert gas supply pipe 232h. The $N_2$ gas is supplied into the process chamber 201 through the first gas supply pipe 232a, the third gas supply pipe 232c, the first nozzle 249a, the third nozzle 249c, and the buffer chamber 237 and is exhausted through the exhaust pipe 231.

In this case, the APC valve 244 is appropriately adjusted such that the internal pressure of the process chamber 201 to fall within a range of, for example, 1 to 13,300 Pa, specifically, 500 to 5,000 Pa. The internal pressure of the process chamber 201 is set to fall within such a relatively high pressure range to allow the TMB gas and the $C_3H_6$ gas to be thermally activated under non-plasma conditions. In addition, when the TMB gas and the $C_3H_6$ are thermally activated and supplied, it is possible to generate a relatively soft reaction so as to perform the modification more softly, which will be described later. The supply flow rate of the TMB gas controlled by the MFC 241b is set to fall within a range of, for example, 1 to 1,000 sccm. The supply flow rate of the $C_3H_6$ gas controlled by the MFC 241d is set to fall within a range of, for example, 100 to 10,000 sccm. The supply flow rate of the $N_2$ gas controlled by each of MFCs 241f to 241i is set to fall within a range of, for example, 100 to 10,000 sccm. Here, a partial pressure of the TMB gas in the process chamber 201 is set to fall within a range of, for example, 0.01 to 12,667 Pa. In addition, a partial pressure of the $C_3H_6$ gas in the process chamber 201 is set to fall within a range of, for example, 0.01 to 13,168 Pa. A time for supplying the TMB gas and the $C_3H_6$ gas activated by heat to the wafers 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within a range of, for example, 250 to 700 degrees C., specifically, 300 to 650 degrees C., more specifically, 350 to 600 degrees C., in the same manner as described with respect to Step 1a.

Under the above conditions, when the TMB gas is supplied on to the wafer 200, the Si-containing layer containing Cl, which is the first layer formed on the wafer 200 in Step 1a, reacts with the TMB gas. As such, Cl (chloro group) in the first layer reacts with a ligand (methyl group) in TMB. Accordingly, the Cl in the first layer that reacts with the ligand in the TMB may be separated (or extracted) from the first layer, and the ligand in the TMB that reacts with the Cl in the first layer may also be separated from the TMB. Further, N in a borazine ring of the TMB from which the ligand is separated may be bonded to Si of the first layer. Thus, among B and N constituting the borazine ring of the TMB, N subjected to having an uncombined hand (i.e., dangling bond) due to the separation of the metal ligand may be bonded to Si subjected to having a dangling bond or having had a dangling bond which is included in the first layer, thereby forming a Si—N bond. Thus, the borazine ring skeleton constituting the borazine ring of the TMB is maintained without being broken.

In addition, by supplying the $C_3H_6$ gas while supplying the TMB gas, specifically, by supplying the $C_3H_6$ gas during a period of supplying the TMB gas, the C component in the $C_3H_6$ gas is newly incorporated in the first layer. Specifically, by supplying the $C_3H_6$ gas to the wafer 200, the $C_3H_6$ gas is adsorbed onto the surface of the first layer and thus, the C component in the $C_3H_6$ gas is newly introduced into the first layer. Here, for example, Si—C bonds may also be generated by bonding C in the $C_3H_6$ gas to Si in the first layer.

As the TMB gas and the $C_3H_6$ gas are supplied under the conditions as described above, the first layer, the TMB gas, and the $C_3H_6$ gas may appropriately react with one another while the borazine ring skeleton in the TMB is maintained without breaking and thus, it is possible to cause a series of the above-described reactions. In addition, the most important factors (or conditions) for causing the series of the above-described reactions in a state where the borazine ring skeleton in the TMB is maintained are the temperature of the wafer 200 and the internal pressure of the process chamber 201, especially the temperature of the wafer 200. Thus, it is possible to cause appropriate reactions by appropriately controlling those factors.

Through the series of reactions, the borazine ring is newly introduced into the first layer, and the first layer is changed (or modified) into a second layer having the borazine ring skeleton and containing Si, B, C, and N, i.e., a SiBCN layer having a borazine ring skeleton (hereinafter, which may also be simply referred to as a SiBCN layer). The second layer becomes a layer having a thickness, for example, from less than one atomic layer to several atomic layers. The SiBCN layer including the borazine ring skeleton may also be referred to as a layer containing Si, C, and a borazine ring skeleton.

As the borazine ring is newly introduced into the first layer, the B component constituting the borazine ring is newly introduced into the first layer. Further, the N component constituting the borazine ring and the C component contained in the ligand of the TMB are newly introduced into the first layer.

Further, as described above, the C component contained in the $C_3H_6$ gas as well as the C component contained in the TMB gas is newly introduced into the first layer. Therefore, the second layer becomes a layer having a large amount of the C component, i.e., a C-rich layer, as compared to a layer obtained by modifying the first layer without supplying the $C_3H_6$ gas to the wafer 200 (i.e., a layer obtained by supplying only the TMB gas to the wafer 200 to modify the first layer).

In forming the second layer, Cl in the first layer and H in the TMB gas or the $C_3H_6$ gas forms, for example, gaseous substances such as chlorine ($Cl_2$) gas, hydrogen ($H_2$) gas, and hydrogen chloride (HCl) gas in the course of the modification reaction of the first layer by the TMB gas and the $C_3H_6$ gas, and is exhausted from the process chamber 201 through the exhaust pipe 231. As such, impurities in the first layer such as Cl are separated from the first layer by being extracted or desorbed from the first layer. Thus, the second layer becomes a layer having fewer impurities such as Cl than the first layer.

Further, in forming the second layer, by maintaining the borazine ring skeleton constituting the borazine ring in the TMB without being broken, a central space of the borazine ring can be maintained and thus a SiBCN layer can be formed to have a porous shape.

(Residual Gas Removal)

After the second layer is formed, the valve 243b of the second gas supply pipe 232b and the valve 243d of the fourth gas supply pipe 232d are closed to stop the supply of the TMB gas and the $C_3H_6$ gas. At this time, while the APC valve 244 of the exhaust pipe 231 is in an open state, the interior of the process chamber 201 is vacuum-exhausted by the vacuum pump 246 to remove from the process chamber 201 the residual gas, which has not reacted or remains after contributing to the formation of the second layer, and reaction byproducts remaining in the process chamber 201. In this operation, the supply of the $N_2$ gas as an inert gas into the process chamber 201 is maintained by keeping the valves 243f to 243i in an open state. The $N_2$ gas acts as a purge gas so as to enhance the effect of removing the residual gas, which has not reacted or remains after contributing to the formation of the second layer, and reaction byproducts remaining in the process chamber 201.

In this case, the gas remaining in the process chamber 201 may incompletely be removed, and the interior of the process chamber 201 may incompletely be purged. When the gas remaining in the process chamber 201 is very small in amount, there is no adverse effect to be generated in following Step 1a. Here, an amount of the $N_2$ gas supplied into the process chamber 201 need not be a large amount. For example, approximately the same amount of the $N_2$ gas as the volume of the reaction tube 203 (or the process chamber 201) may be supplied to perform the purging such that there is no adverse effect to be generated in Step 1a. As described above, as the interior of the process chamber 201 is purged incompletely, the purge time can be reduced and thus the throughput can be improved. In addition, the consumption of the $N_2$ gas can also be suppressed to a minimal necessity.

Figure 16D:
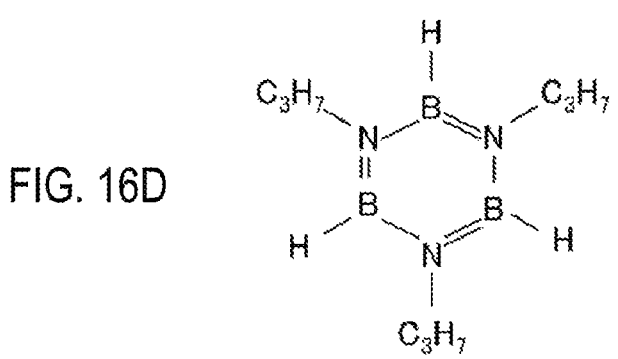
FIG. 16D illustrates a chemical structural formula of n,n', n"-tri-n-propylborazine.

Examples of the reaction gas including the organic borazine compound may include n,n', n"-triethylborazine (abbreviation: TEB) gas, n,n',n"-tri-n-propylborazine (abbreviation: TPB) gas, n,n',n"-triisopropylborazine (abbreviation: TIPB) gas, n,n',n"-tri-n-butyl borazine (abbreviation: TBB) gas, n,n',n"-triisobutylborazine (abbreviation: TIBB) gas and the like, in addition to the TMB gas. For example, the TPB may be represented by the chemical structural formula shown in FIG. 16B in which $R_1$, $R_3$, and $R_5$ are H while $R_2$, $R_4$, and $R_6$ are a propyl group (—$C_3H_7$), or a chemical structural formula shown in FIG. 16D. In addition, TMB is a borazine compound having a borazine ring skeleton and containing a methyl group as a ligand. TEB is a borazine compound having a borazine ring skeleton and containing an ethyl group as a ligand. TPB is a borazine compound having a borazine ring skeleton and containing a propyl group as a ligand. TIPB is a borazine compound having a borazine ring skeleton and containing an isopropyl group as a ligand. TBB is a borazine compound having a borazine ring skeleton and containing a butyl group as a ligand. TIBB is borazine compound having a borazine ring skeleton and containing an isobutyl group as a ligand.

Examples of the carbon-containing gas may include hydrocarbon-based gases such as acetylene ($C_2H_4$) gas, ethylene ($C_2H_2$) gas and the like, that is, N-free carbon-containing gases, in addition to the propylene ($C_3H_6$) gas. By the use of the hydrocarbon-based gas which contains C atoms but does not contain N atoms in the composition formula (e.g., one molecule) as the carbon-containing gas, it is possible to suppress the N component originating from the carbon-containing gas from being added to the first layer, ultimately, to the second layer, when the carbon-containing gas is supplied to the wafer 200 in Step 2a. Accordingly, the N component can be added into the second layer only with the TMB gas as a nitrogen source. As a result, it is possible to increase in the C concentration, while suppressing an increase in the N concentration in the SiBCN film having a borazine ring skeleton, which is formed by a process being performed a predetermined number of times as will be described later.

As described above, by appropriately selecting the gas species (i.e., composition) of the reaction gas and the gas species (i.e., composition) of the carbon-containing gas, it is possible to appropriately control the composition ratio of the SiBCN film.

Furthermore, in order to further increase the C concentration in the SiBCN film, the internal pressure of the process chamber 201 when the TMB gas and the $C_3H_6$ gas are supplied in Step 2a may be set to be greater than the internal pressure of the process chamber 201 when the HCDS gas is supplied in Step 1a. The hydrocarbon gas, such as the $C_3H_6$ gas, tends not to be adsorbed much to the first layer, but by setting the internal pressure of the process chamber 201 as described above, it is possible to promote the adsorption of the $C_3H_6$ gas to the first layer, and promote the reaction between the first layer and the TMB gas. As a result, the C concentration in the second layer formed in Step 2a, i.e., the C concentration in the SiBCN film can be further increased. In contrast, in order to appropriately control an increase in the C concentration of the SiBCN film, the internal pressure of the process chamber 201 when the TMB gas and the $C_3H_6$ gas may be set to be lower than the internal pressure of the process chamber 201 when the HCDS gas is supplied. Thus, by appropriately controlling the internal pressure of the process chamber 201 when the TMB gas and the $C_3H_6$ gas are supplied, the C concentration in the SiBCN film can be finely adjusted.

Further, the C concentration in the SiBCN film can also be finely adjusted by controlling supply conditions such as supply times and supply flow rates of the TMB gas and the $C_3H_6$ gas. For example, in Step 2a, by extending the gas supply time of the TMB gas or the $C_3H_6$ gas or by increasing the supply flow rate of the TMB gas or the $C_3H_6$ gas, the C concentration of the SiBCN film can be further increased. Furthermore, for example, by increasing a ratio of the supply flow rate of the $C_3H_6$ gas to the supply flow rate of the TMB gas, that is to say, by setting the partial pressure of the $C_3H_6$ gas in the process chamber 201 to be greater than the partial pressure of the TMB gas in the process chamber 201, the C concentration in the SiBCN film can be increased. In addition, for example, in Step 2a, by reducing the gas supply time of the TMB gas or the $C_3H_6$ gas or decreasing the supply flow rate of the TMB gas or the $C_3H_6$ gas, an increase in the C concentration in the SiBCN film can be appropriately controlled. Furthermore, for example, by reducing the ratio of the supply flow rate of the $C_3H_6$ gas to the supply flow rate of the TMB gas, that is to say, by setting the partial pressure of the $C_3H_6$ gas in the process chamber 201 to be smaller than the partial pressure of the TMB gas in the process chamber 201, an increase in the C concentration in the SiBCN film can be appropriately controlled.

In this manner, by controlling supply conditions (a supply time, a supply flow rate, a partial pressure of a gas, an internal pressure of the process chamber 201 and the like) in supplying the TMB gas and the $C_3H_6$ gas, the C concentration of the SiBCN film can be finely adjusted.

Examples of the inert gas may include a rare gas such as Ar gas, He gas, Ne gas, Xe gas and the like, in addition to the $N_2$ gas.

(Performing Predetermined Number of Times)

A cycle in which Steps 1a and 2a are performed may be set as one cycle and the cycle may be performed one or more times (e.g., a predetermined number of times). As such, Steps 1a and 2a are alternately performed one or more times (e.g., a predetermined number of times) to form on the wafer 200 a thin film having a borazine ring skeleton and containing Si, B, C, and N (hereinafter, which may also be referred to as a SiBCN film having a borazine ring skeleton, or simply a SiBCN film), which has a predetermined composition and a predetermined film thickness. Further, it may be preferred that the above cycle be repeated a plurality of times. Thus, a thickness of the SiBCN layer formed per cycle may be set to be smaller than a desired film thickness and the above cycle may be repeated a plurality of times until the desired film thickness is obtained. The SiBCN film having a borazine ring skeleton may also be referred to as a thin film containing Si, C, and a borazine ring skeleton.

In this case, ratios of individual components (i.e., Si component, B component, C component, and N component) in the SiBCN layer having a borazine ring skeleton, that is to say, a Si concentration, a B concentration, a C concentration, and a N concentration can be finely adjusted by controlling the process conditions such as the internal pressure of the process chamber 201 or the gas supply time in each step, thereby precisely controlling a composition ratio of the SiBCN film having a borazine ring skeleton.

In addition, when the cycle is performed a plurality of times, the phrase "a predetermined gas is supplied to the wafer 200" in each step after at least two cycles may mean that the predetermined gas is supplied to a layer formed on the wafer 200, i.e., an uppermost surface of the wafer 200, which is a laminated body. The phrase "a predetermined layer is formed on the wafer 200" may mean that the predetermined layer is formed on a layer formed on the wafer 200, i.e., an uppermost surface of the wafer 200, which is a laminated body. Also, the above-described matters are similar in respective modifications and other embodiments which will be described later.

(Purge and Return to Atmospheric Pressure)

Once the film forming process of forming the SiBCN film having a borazine ring skeleton, which has a predetermined composition and a predetermined film thickness, is performed, the valves 243f to 243i are opened to supply the $N_2$ gas as an inert gas into the process chamber 201 from each of the inert gas supply pipes 232f to 232i and the $N_2$ gas is exhausted through the exhaust pipe 231. The $N_2$ gas acts as the purge gas and the interior of the process chamber 201 is purged with the inert gas, so that the gas and the reaction byproducts remaining in the process chamber 201 are removed from the process chamber 201 (i.e., purge). Subsequently, the internal atmosphere of the process chamber 201 is substituted with the inert gas (i.e., inert gas substitution), and the internal pressure of the process chamber 201 returns to normal pressure (i.e., return to atmospheric pressure).

(Boat Unload and Wafer Discharge)

Thereafter, the seal cap 219 is lowered by the boat elevator 115 to open the lower end of the reaction tube 203, and the processed wafer 200 supported by the boat 217 is unloaded to the outside of the reaction tube 203 through the lower end of the reaction tube 203 (i.e., boat unload). Then, the processed wafers 200 are discharged from the boat 217 (i.e., wafer discharge).

(3) Effects According to the Present Embodiment

According to the present embodiment, one or more effects may be achieved as described below.

(a) According to the film forming sequence of the present embodiment, by performing the cycle including Steps 1a and 2a a predetermined number of times, a SiBCN film having a high resistance to HF and a low dielectric constant can be formed on the wafer 200 in a low temperature range, as compared with a conventional SiCN film, SiOCN film, or the like. Thus, a thin film having both an improved resistance to HF and a reduced dielectric constant, which are in a trade-off relationship, can be formed in a low temperature range.

(b) According to the film forming sequence of the present embodiment, the HCDS gas is supplied in Step 1a to form the first layer on the wafer 200 and then, the TMB gas and the $C_3H_6$ gas are supplied in Step 2a to modify the first layer and form the second layer. Accordingly, the composition of the SiBCN film can be easily controlled to have desired properties.

In particular, according to the film forming sequence of the present embodiment, by supplying the TMB gas as the first carbon source and supplying the $C_3H_6$ gas as the second carbon source in one cycle, that is, by forming the film using two kinds of carbon sources (i.e., double carbon source) in one cycle, it is possible to further add the C component in the $C_3H_6$ gas to the SiBCN film as well as the C component in the TMB gas. As such, the C concentration of the SiBCN film can be further increased.

Further, according to the film forming sequence of the present embodiment, a hydrocarbon-based gas (e.g., $C_3H_6$ gas) which contains C atoms but does not contain N atoms in the composition formula (e.g., in one molecule) may be used as the carbon-containing gas. Accordingly, no N component originating from the carbon-containing gas can be added into the second layer when the carbon-containing gas is supplied in Step 2a. This makes it easier to increase the C concentration, while suppressing an increase in the N concentration in the SiBCN film.

Furthermore, by adjusting the B concentration and the C concentration of the SiBCN film, the resistance of the SiBCN film to HF or hot phosphoric acid can be controlled. For example, by increasing the B concentration and the C concentration of the SiBCN film, the resistance to HF can be increased than that of the SiN film, and by lowering the B concentration and the C concentration in the film, the resistance to HF can be lowered than that of the SiN film. In addition, when the B concentration in the film is increased or decreased, a change in the resistance to hot phosphoric acid may be different from a change in the resistance to HF, and when the C concentration in the film is increased or decreased, a change in the resistance to hot phosphoric acid may be similar to a change in the resistance to HF. For example, by increasing the B concentration of the SiBCN film, the resistance to hot phosphoric acid can be lowered than that of the SiN film, and by lowering the B concentration in the film, the resistance to hot phosphoric acid can be increased than that of the SiN film. Further, for example, by increasing the C concentration of the SiBCN film, the resistance to hot phosphoric acid can be increased than that of the SiN film, and by lowering the C concentration in the film, the resistance to hot phosphoric acid can be lowered than that of the SiN film.

(c) According to the film forming sequence of the present embodiment, a gas including an organic borazine compound, which has a high reducibility and a high reactivity with an atom of a halogen element such as Cl (e.g., TMB gas) may be used as the reaction gas. Thus, the first layer can efficiently react with the reaction gas in Step 2a and the second layer can be formed efficiently. Accordingly, the productivity of the film forming process of the SiBCN film can be improved.

Further, in the film forming sequence of the present embodiment, the SiBCN film containing four elements of Si, B, N, and C can be formed by using the three kinds of gases of the HCDS gas, the TMB gas, and the $C_3H_6$ gas. Thus, when the film is formed, it is not necessary to separately supply four kinds of precursors of a silicon precursor, a boron precursor, a nitrogen source, and a carbon source. Therefore, it is possible to reduce the time required per cycle and to further improve the productivity of the film forming process.

Furthermore, in the film forming sequence of the present embodiment, the time required per cycle can be shortened by simultaneously supplying the $C_3H_6$ gas and the TMB gas, as compared with a case of separately supplying the gases. Thus, a decrease in the throughput in the formation of the SiBCN film and a decrease in the productivity of the film forming process can be avoided.

(d) According to the film forming sequence of the embodiment, when the second layer is formed, the SiBCN film can be made to a porous film, which further lowers the dielectric constant of the film, by maintaining the borazine ring skeletons constituting the borazine rings in the organic borazine compound without being broken. As such, a low dielectric constant film (i.e., a low-k film) having very a low dielectric constant with a porous structure can be formed.

Furthermore, according to the film forming sequence of the present embodiment, when the second layer is formed, a central space of the borazine ring can be abolished, for example, by increasing the wafer temperature or the internal pressure of the process chamber, compared with the processing conditions as described above, to break (not to maintain) at least a portion of the borazine ring skeletons constituting the borazine rings in the organic borazine compound. Thus, it is possible to vary a state (e.g., density) of the borazine ring skeletons in the SiBCN film, ultimately, a porous state (e.g., density) of the SiBCN film, so that the dielectric constant of the SiBCN film can be finely adjusted.

Thus, according to the film forming sequence of the present embodiment, the dielectric constant of the SiBCN film can be controlled, by changing the state of the borazine ring skeletons in the SiBCN film, in other words, by maintaining the borazine ring skeletons or breaking at least a portion thereof. Further, it is possible to control the film stress by varying the state of the borazine ring skeletons in the film.

(e) According to the film forming sequence of the present embodiment, impurities such as Cl can be extracted or desorbed from the first layer by allowing the first layer and the TMB gas to react with each other in Step 2a. As a result, it is possible to reduce the impurity concentration in the SiBCN film and to further improve the resistance of the SiBCN film to HF.

Modified Example 1

Figure 5B:
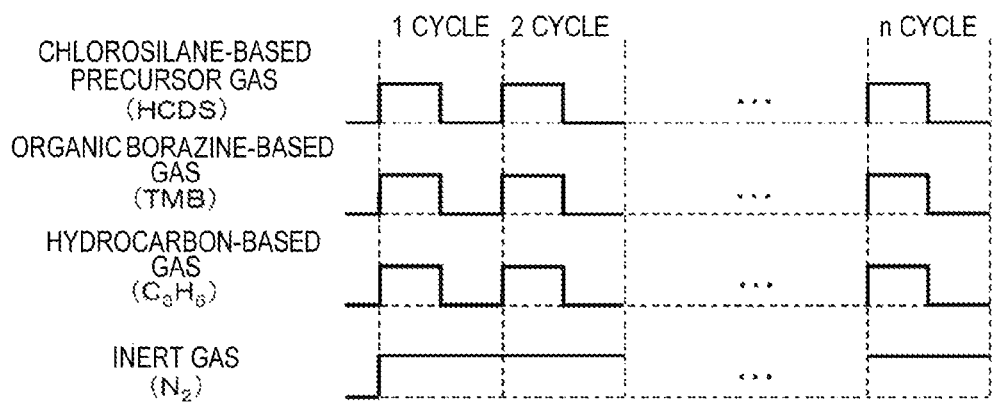
FIG. 5B illustrates a modified timing diagram for supplying gases in the film forming sequence according to the first embodiment of the present disclosure.
Figure 5C:
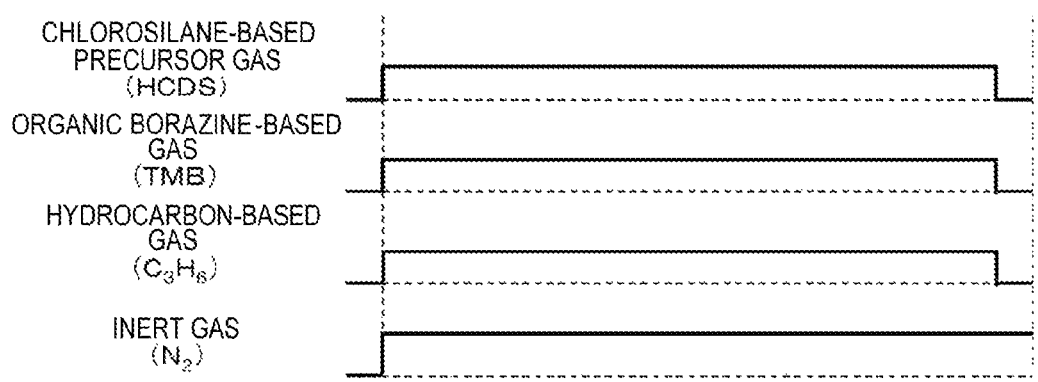
FIG. 5C illustrates another modified timing diagram for supplying gases in the film forming sequence according to the first embodiment of the present disclosure.

In the film forming sequence as described above with respect to FIGS. 4 and 5A, an example is described in which a cycle for alternately performing Steps 1a and 2a is performed one or more times (e.g., a predetermined number of times), but the present embodiment is limited thereto. For example, a cycle in which Steps 1a and 2a are simultaneously performed may be performed one or more times (e.g., a predetermined number of times). Specifically, the HCDS gas, the TMB gas, and the $C_3H_6$ may be simultaneously supplied. FIG. 5B illustrates an example of performing a plurality of times (e.g., n times; n being an integer greater than 1) the cycle in which Steps 1a and 2a are simultaneously performed, and FIG. 5C illustrates an example of performing once a cycle in which Steps 1a and 2a are performed simultaneously. In the film forming sequence shown in FIG. 5B, the thickness of the SiBCN film can be controlled by mainly adjusting the number of times for performing the cycle. In the film forming sequence shown in FIG. 5C, the thickness of the SiBCN film can be controlled by mainly adjusting the time for performing the cycle (i.e., the gas supply time). The processing conditions of those examples may also be similarly set to the processing conditions in the film forming sequence shown in FIGS. 4 and 5A.

Thus, although the HCDS gas, the TMB gas, and the $C_3H_6$ gas are simultaneously supplied, the same effects as those of the above-described embodiment may be achieved. However, as in the above-described embodiment, the case of alternately performing the supply of the HCDS gas and the supply of the TMB and $C_3H_6$ gases with purging of the process chamber 201 interposed therebetween may be preferred, since it is possible to allow the HCDS gas, the TMB gas, and the $C_3H_6$ gas to appropriately react with one another under the condition in which the surface reaction is dominant and to better control of the film thickness control.

Modified Example 2

Furthermore, in the film forming sequence as described above with respect to FIGS. 4 and 5A, an example is described in which the $C_3H_6$ gas is supplied in Step 2a of supplying the TMB gas, but the present embodiment is not limited thereto. For example, the $C_3H_6$ gas may be supplied in Step 1a of supplying the HCDS gas. Further, the $C_3H_6$ gas may also be supplied in both Steps 1a and 2a.

In any examples, the same effects as those of the above-described embodiment can be achieved. However, supplying the $C_3H_6$ gas in step 2a may be preferred rather than supplying the $C_3H_6$ gas in Step 1a, since it is possible to avoid the gas phase reaction between the HCDS gas and the $C_3H_6$ gas in the process chamber 201, that is, it is possible to suppress the generation of particles in the process chamber 201.

Second Embodiment of the Present Disclosure

Hereinafter, a second embodiment of the present disclosure is described.

In the first embodiment, an example is described in which a SiBCN film having a borazine ring skeleton is formed on a substrate by performing a cycle including Steps 1a and 2a a predetermined number of times. However, in the second embodiment, an example is described in which a SiBCN film having a borazine ring skeleton is formed on the substrate by performing a predetermined number of times a cycle including Step 3b of supplying the nitriding gas ($NH_3$ gas) to the substrate, in addition to Steps 1b and 2b performed in the same manner as Steps 1a and 2a.

(First Sequence)

Figure 7A:
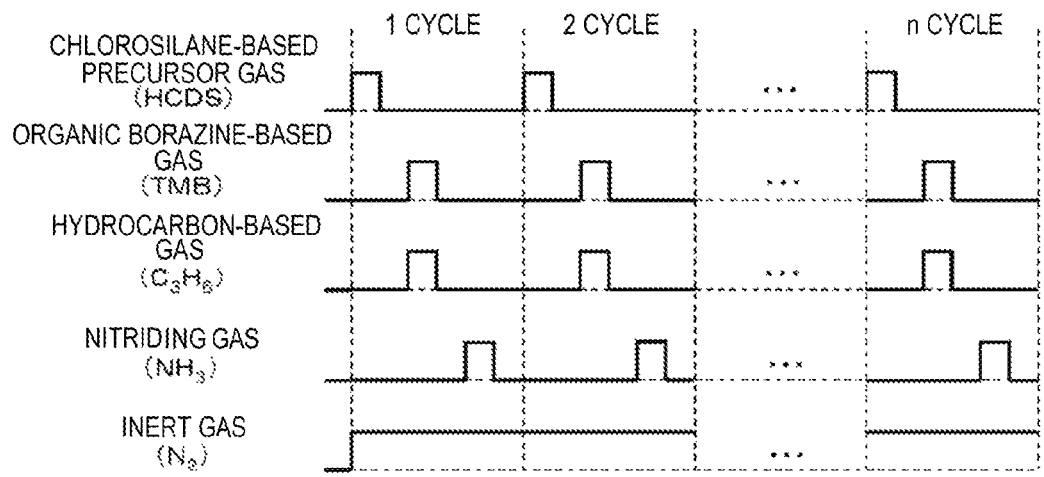
FIG. 7A illustrates an example of a sequence of timings for supplying gases in the first film forming sequence, in which a film is formed under non-plasma conditions, according to the second embodiment of the present disclosure.
Figure 7B:
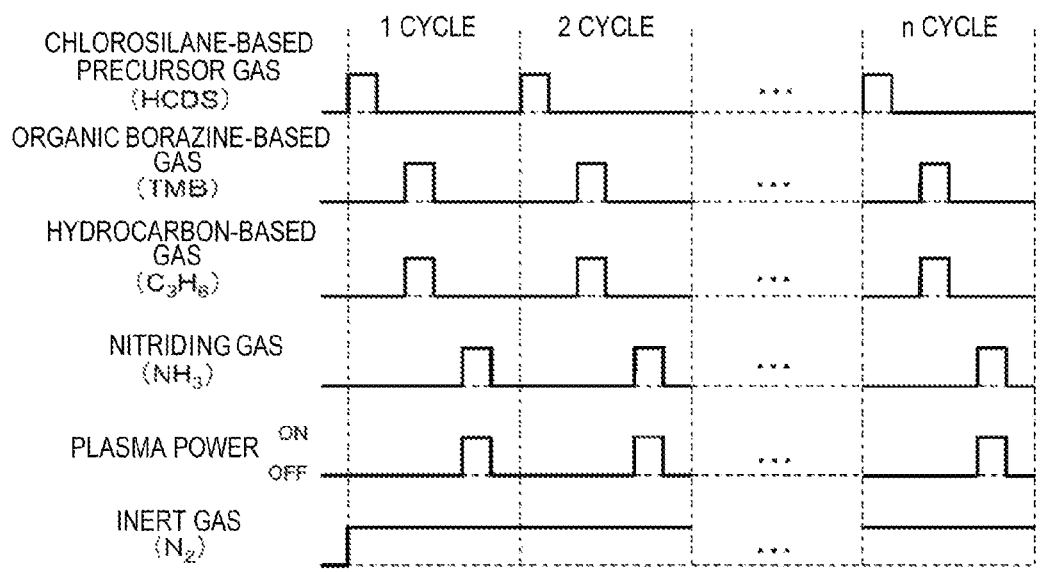
FIG. 7B illustrates an example of a sequence of timings for supplying gases and plasma power in the first film forming sequence, in which a film is formed using plasma, according to the second embodiment of the present disclosure.

A first film forming sequence of the present embodiment is described later. FIG. 6 illustrates a flowchart a method for film forming in the first film forming sequence according to the second embodiment. FIG. 7A illustrates an example of a sequence of timings for supplying gases in the first film forming sequence, in which a film is formed under non-plasma conditions, according to the second embodiment. FIG. 7B illustrates an example of a sequence of timings for supplying gases and plasma power (e.g., high-frequency power) in the first film forming sequence, in which a film is formed using plasma, according to the second embodiment.

In the first sequence of the present embodiment, the SiBCN film having a borazine ring skeleton is formed on the wafer 200, by performing a cycle a predetermined number of times under a condition in which a borazine ring skeleton in an organic borazine compound is maintained. The cycle includes: supplying the HCDS gas as a chlorosilane-based precursor gas containing Si and Cl to the wafer 200; supplying the TMB gas as a reaction gas including the organic borazine compound to the wafer 200; and supplying the $NH_3$ gas as a nitriding gas to the wafer 200.

Here, among processes of supplying the HCDS gas, supplying the TMB gas, and supplying the $NH_3$ gas, the $C_3H_6$ gas as a carbon-containing gas may be supplied to the wafer 200 in the process of supplying the TMB gas. Further, in the process of supplying the TMB gas, the $C_3H_6$ gas may be supplied in a period in which the TMB gas is supplied. As such, the TMB gas and the $C_3H_6$ gas may be simultaneously supplied to the wafer 200.

The first film forming sequence of the present embodiment has the same configurations as those of the film forming sequence of the first embodiment except that the former further includes Step 3b in addition to Steps 1b and 2b performed in the same manner as Steps 1a and 2a. Hereinafter, Step 3b in the present embodiment is described.

[Step 3b]

($NH_3$ Gas Supply)

After Step 2b is completed by removing the residual gas from the process chamber 201, the valve 243c of the third gas supply pipe 232c is opened to flow $NH_3$ gas into the third gas supply pipe 232c. A flow rate of the $NH_3$ gas flowing into the third gas supply pipe 232c is adjusted by the MFC 241c. The flow rate-adjusted $NH_3$ gas is supplied into the buffer chamber 237 through the gas supply holes 250c of the third nozzle 249c. Here, if no high-frequency power is applied between the first rod-shaped electrode 269 and the second rod-shaped electrode 270, the $NH_3$ gas supplied into the buffer chamber 237 is excited (or activated) by heat, supplied into the process chamber 201 through the gas supply holes 250e, and exhausted through the exhaust pipe 231 (see FIG. 7A). In contrast, if high-frequency power is applied between the first rod-shaped electrode 269 and the second rod-shaped electrode 270 from the high-frequency power supply 273 through the matching unit 272, the $NH_3$ gas supplied into the buffer chamber 237 is plasma-excited, supplied as an active species into the process chamber 201 through the gas supply hole 250e, and exhausted through the exhaust pipe 231 (see FIG. 7B). In this manner, the $NH_3$ gas which is heat-excited or plasma-excited is supplied to the wafers 200. In this case, the valve 243h is opened to flow the $N_2$ gas into the third inert gas supply pipe 232h. The $N_2$ gas is supplied into the process chamber 201, together with the $NH_3$ gas, and exhausted through the exhaust pipe 231.

During this operation, in order to prevent infiltration of the $NH_3$ gas into the first nozzle 249a, the second nozzle 249b, and the fourth nozzle 249d, the valves 243f, 243g, and 243i are opened to flow the $N_2$ gas into the first inert gas supply pipe 232f, the second inert gas supply pipe 232g, and the fourth inert gas supply pipe 232i. The $N_2$ gas is supplied into the process chamber 201 through the first gas supply pipe 232a, the second gas supply pipe 232b, the fourth gas supply pipe 232d, the first nozzle 249a, the second nozzle 249b, and the fourth nozzle 249d, and exhausted through the exhaust pipe 231.

When the $NH_3$ gas is heat-excited (not plasma-excited), the APC valve 244 is appropriately adjusted such that the internal pressure of the process chamber 201 falls within a range of, for example, 1 to 3,000 Pa. The internal pressure of the process chamber 201 is set to a relatively high pressure range so as to allow the $NH_3$ gas to be thermally activated under non-plasma conditions. In addition, when the $NH_3$ gas is thermally activated and supplied, it is possible to generate a relatively soft reaction so as to perform the nitriding more softly, which will be described later. Here, a partial pressure of the $NH_3$ gas in the process chamber 201 is set to fall within a range of, for example, 0.01 to 2,970 Pa. The supply flow rate of the $NH_3$ gas controlled by the MFC 241c is set to fall within a range of, for example, 100 to 10,000 sccm. The supply flow rate of the $N_2$ gas controlled by each of the MFCs 241f to 241i is set to fall within a range of, for example, 100 to 10,000 sccm. A time for supplying the thermally activated $NH_3$ to the wafers 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within, for example, a range of 250 to 700 degrees C., specifically, 300 to 650 degrees C., more specifically, 350 to 600 degrees C., in the same manner as described with respect to Steps 1b and 2b.

When the $NH_3$ gas is plasma-excited and supplied as an active species, the APC valve 244 is appropriately adjusted such that the internal pressure of the process chamber 201 falls within a range of, for example, 1 to 100 Pa. Here, a partial pressure of the $NH_3$ gas in the process chamber 201 is set to fall within a range of, for example, 0.01 to 100 Pa. The supply flow rate of the $NH_3$ gas controlled by the MFC 241c is set to fall within a range of, for example, 100 to 10,000 sccm. The supply flow rate of the $N_2$ gas controlled by each of the MFCs 241f to 241i is set to fall within a range of, for example, 100 to 10,000 sccm. A time for supplying the active species obtained by plasma-exciting the $NH_3$ gas to the wafers 200, in other words, a gas supply time (i.e., an irradiation time), is set to fall within a range of, for example, 1 to 120 seconds, specifically, 1 to 60 seconds. In this case, the temperature of the heater 207 is set such that the temperature of the wafers 200 falls within, for example, a range of 250 to 700 degrees C., specifically, 300 to 650 degrees C., more specifically, 350 to 600 degrees C., in the same manner as described with respect to Steps 1b and 2b. The high-frequency power applied between the first rod-shaped electrode 269 and the second rod-shaped electrode 270 from the high-frequency power supply 273 is set to fall within a range of, for example 50 to 1,000 W.

Here, the gas flowing into the process chamber 201 is the $NH_3$ gas which is thermally activated by increasing the internal pressure of the process chamber 201 or the active species obtained by plasma-exciting the $NH_3$ gas, while none of the HCDS gas, the TMB gas, and the $C_3H_6$ gas is allowed to flow in the process chamber 201. Accordingly, the $NH_3$ gas is activated without a gas phase reaction, or the $NH_3$ gas converted into an active species reacts with at least a portion of the second layer having a borazine ring skeleton and containing Si, B, C, and N formed on the wafer 200 in Step 2b. Accordingly, the second layer is nitrided and modified into a third layer (SiBCN layer) having a borazine ring skeleton and containing Si, B, C, and N. The third layer is a layer having a thickness of a range, for example, from less than one atomic layer to several atomic layers. In addition, the third layer has an N concentration higher than that of the second layer and a C concentration lower than that of the second layer.

In the process of forming the third layer, the second layer is modified by nitriding the second layer by the nitriding gas under the conditions in which the borazine ring skeleton in the second layer is maintained. In this case, N is further added to the second layer by the nitridation of the second layer. In addition, the nitridation of the second layer allows at least a portion of C in the second layer to be separated (or extracted) from the second layer. In this case, the borazine ring skeleton constituting the borazine ring included in the second layer is maintained without being broken.

When the $NH_3$ gas is supplied under the above conditions, the second layer can properly react with the $NH_3$ gas while maintaining the borazine ring skeleton in the second layer without being broken, thereby causing the above-described reaction. In addition, it is believed that the most important factors (or conditions) for causing this reaction, with maintaining the borazine ring skeleton in the second layer, are the temperature of the wafers 200 and the internal pressure of the process chamber 201, especially the temperature of the wafers 200. Thus, it is possible to cause suitable reactions by appropriately controlling the factors.

In addition, as shown in FIG. 7A, when the thermally-activated $NH_3$ flows into the process chamber 201, the second layer can be thermally nitrided to be modified (or changed) into the third layer. In this case, at least a portion of the C component in the second layer is desorbed (or extracted) by energy of the activated $NH_3$ gas while a ratio of the N component in the second layer is increased, thereby finely adjusting the N concentration and the C concentration in the third layer. Specifically, the composition ratio of the third layer can be finely adjusted in a direction of increasing the N concentration and in a direction of reducing the C concentration. Further, the composition ratio of the third layer can be more precisely controlled by controlling the process conditions such as the internal pressure of the process chamber 201, the gas supply time, and the like.

In addition, as shown in FIG. 7B, when the active species obtained by plasma-activating the $NH_3$ gas flows into the process chamber 201, the second layer can be plasma-nitrided to be modified (or changed) into the third layer. In this case, at least a portion of the C component in the second layer is desorbed (or extracted) by energy of the active species while a ratio of the N component in the second layer is increased, thereby finely adjusting the N concentration and the C concentration in the third layer. Specifically, the composition ratio of the third layer can be finely adjusted in a direction of increasing the N concentration and in a direction of reducing the C concentration. Further, the composition ratio of the third layer can be more precisely controlled by controlling the process conditions such as the internal pressure of the process chamber 201, the gas supply time, and the like.

Here, the nitriding reaction of the second layer may not be saturated. For example, when the second layer having a thickness of a range from less than one atomic layer to several atomic layers is formed in Steps 1b and 2b, a portion of the second layer may be nitrided. In this case, the nitridation may be performed in such a manner that the nitriding reaction of the second layer is unsaturated in order to prevent the entire second layer having the thickness of a range from less than one atomic layer to several atomic layers from being nitrided.

Although the unsaturation of the nitriding reaction of the second layer may be achieved under the above process conditions employed in Step 3b, it can be more easily achieved by changing the process conditions of Step 3b to the following process conditions.
[When $NH_3$ Gas is Activated by Heat]
Wafer temperature: 500 to 650 degrees C.
Internal pressure of process chamber: 133 to 2,666 Pa
Partial pressure of $NH_3$ Gas: 33 to 2,515 Pa
Supply flow rate of $NH_3$ Gas: 1,000 to 5,000 sccm
Supply flow fate of $N_2$ Gas: 300 to 3,000 sccm
Supply time of $NH_3$ Gas: 6 to 60 seconds
[When $NH_3$ Gas is Activated by Plasma]
Wafer temperature: 500 to 650 degrees C.
Internal pressure of process chamber: 33 to 80 Pa
Partial pressure of $NH_3$ gas: 17 to 75 Pa
Supply flow rate of $NH_3$ Gas: 1,000 to 5,000 sccm
Supply flow rate of $N_2$ Gas: 300 to 1,000 sccm
Supply time of $NH_3$ Gas: 6 to 60 seconds
(Residual Gas Removal)

After the third layer is formed, the valve 243c of the third gas supply pipe 232c is closed to stop the supply of the $NH_3$ gas. At this time, while the APC valve 244 of the exhaust pipe 231 is in an open state, the interior of the process chamber 201 is vacuum-exhausted by the vacuum pump 246 to remove from the process chamber 201 the residual $NH_3$ gas, which has not reacted or remains after contributing to the formation of the third layer, and reaction byproducts remaining in the process chamber 201 (i.e., residual gas removal). In this operation, the supply of the $N_2$ gas into the process chamber 201 is maintained by keeping the valves 243f to 243i in an open state. The $N_2$ gas acts as a purge gas so as to enhance the effect of removing from the process chamber 201 the residual $NH_3$ gas, which has not reacted or remains after contributing to the formation of the third layer, and reaction byproducts remaining in the process chamber 201.

In this case, the gas remaining in the process chamber 201 may incompletely be removed and the interior of the process chamber 201 may incompletely be purged. When the gas remaining in the process chamber 201 is very small in amount, there is no adverse effect to be generated in following Step 1b. Here, an amount of the $N_2$ gas supplied into the process chamber 201 need not be a large amount. For example, approximately the same amount of the $N_2$ gas as the volume of the reaction tube 203 (or the process chamber 201) may be supplied to perform the purge such that there is no adverse effect to be generated in Step 1b. As described above, as the interior of the process chamber 201 is incompletely purged, the purge time can be reduced and thus the throughput can be improved. In addition, the consumption of the $N_2$ gas can also be suppressed to a minimal necessity.

Examples of the nitrogen-containing gas may include diazene ($N_2H_2$) gas, hydrazine ($N_2H_4$) gas, $N_3H_8$ gas, a gas including the above compounds and the like, in addition to the $NH_3$ gas. Examples of the inert gas may include a rare gas such as Ar gas, He gas, Ne gas, Xe gas and the like, in addition to the $N_2$ gas.
(Performing Predetermined Number of Times)

A cycle in which Steps 1a and 2a are performed may be set as one cycle and the cycle may be performed one or more times (e.g., a predetermined number of times) to form a SiBCN film having a borazine ring skeleton and containing a predetermined composition, which has a predetermined film thickness, on the wafer 200. Further, it may be preferred that the above cycle be repeated a plurality of times. Thus, a thickness of the SiBCN layer formed per cycle may be set to be smaller than a desired film thickness and the above cycle may be repeated a plurality of times until the desired film thickness is obtained.
(Second Sequence)

Figure 8:
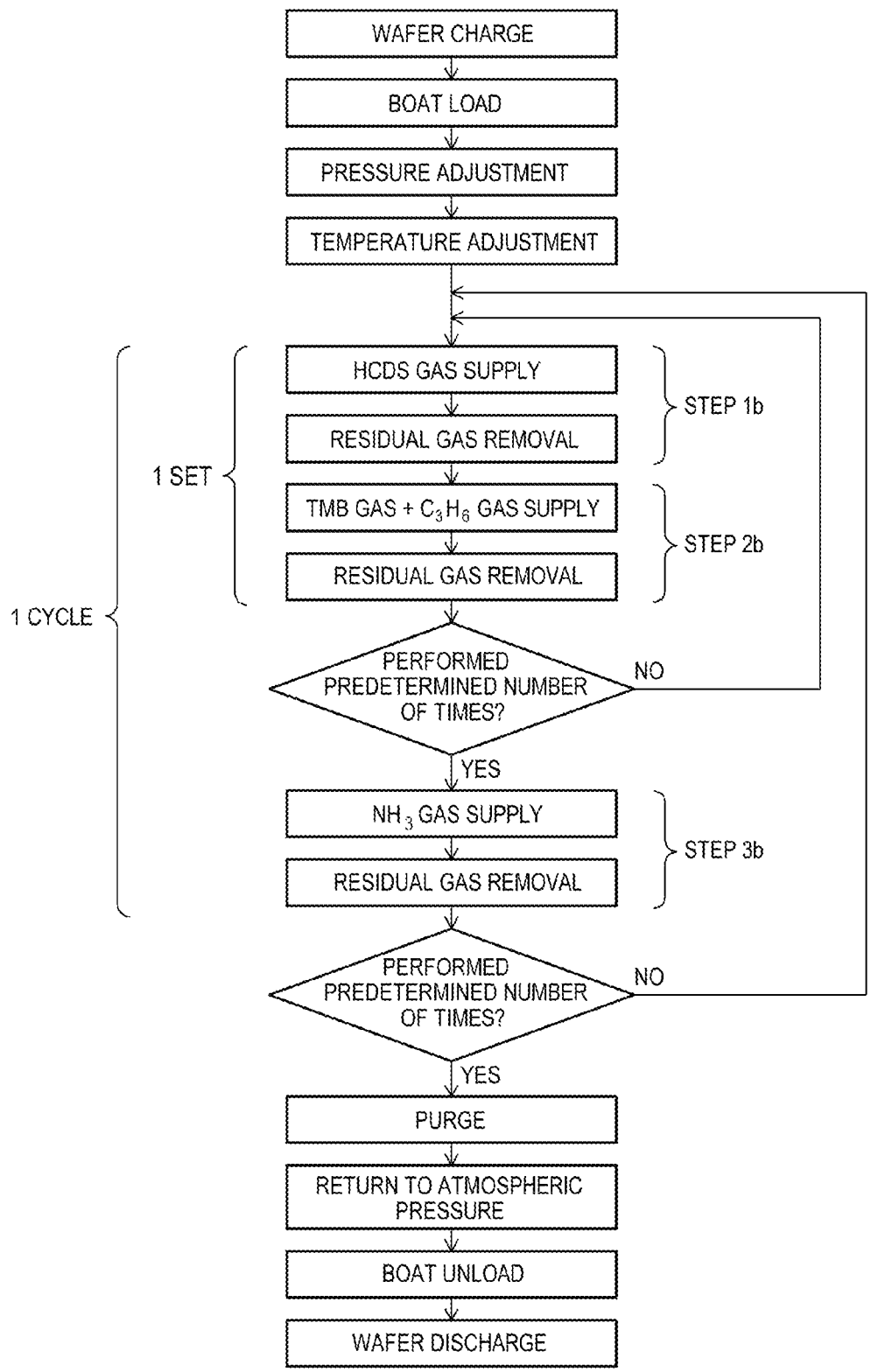
FIG. 8 illustrates a flowchart of a method for film forming in a second film forming sequence according to the second embodiment of the present disclosure.
Figure 9A:
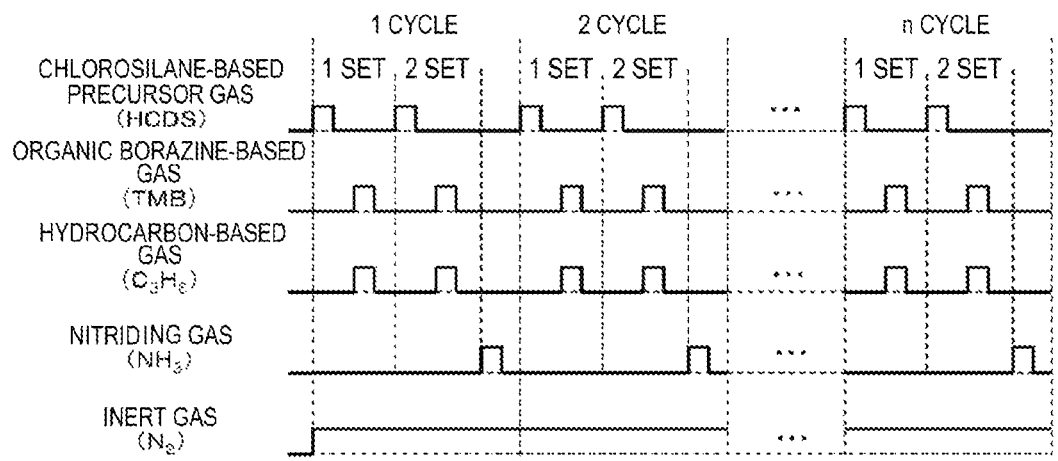
FIG. 9A illustrates an example of a sequence of timings for supplying gases in the second film forming sequence, in which a film is formed under non-plasma conditions, according to the second embodiment of the present disclosure.
Figure 9B:
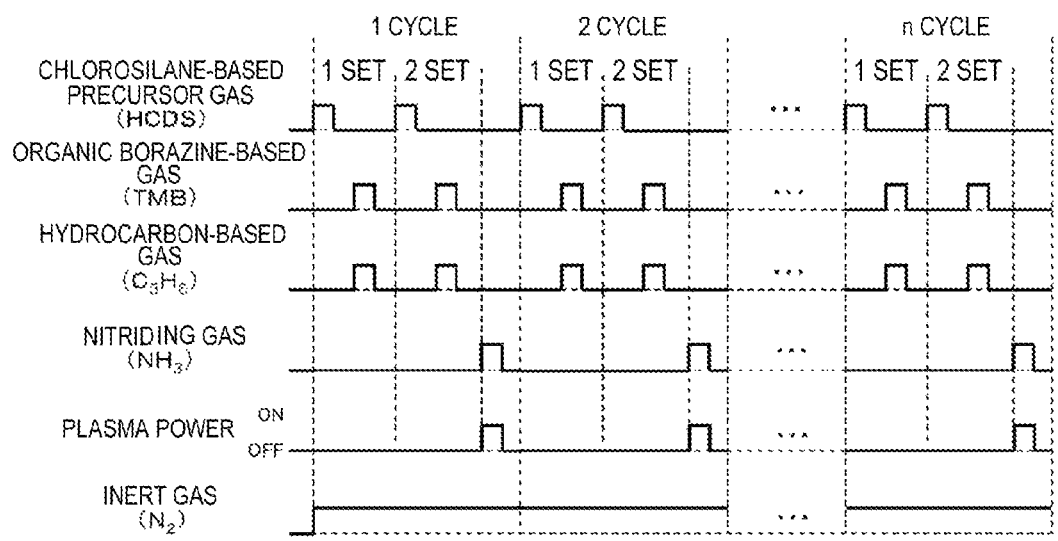
FIG. 9B illustrates an example of a sequence of timing for supplying gases and plasma power in the second film forming sequence, in which a film is formed using plasma, according to the second embodiment of the present disclosure.

A second film forming sequence of the present embodiment is described later. FIG. 8 illustrates a flowchart of a method for film forming in the second film forming sequence according to the second embodiment. FIG. 9A illustrates an example of a sequence of timings for supplying gases in the second film forming sequence, in which a film is formed under non-plasma conditions, according to the second embodiment. FIG. 9B illustrates an example of a sequence of timing for supplying gases and plasma power in the second film forming sequence, in which a film is formed using plasma, according to the second embodiment.

In the second sequence of the present embodiment, a thin film having a borazine ring skeleton, and containing Si, B, C, and N is formed on the wafer 200 by performing a cycle a predetermined number of times. The cycle includes: alternately performing a predetermined number of times supplying HCDS gas as a chlorosilane-based precursor gas containing Si and Cl to the wafer 200, and supplying TMB gas as a reaction gas including an organic borazine compound to the wafer 200; and supplying $NH_3$ gas as a nitriding gas to the wafer 200. The cycle is performed under a condition in which the borazine ring skeleton in the organic borazine compound is maintained.

Here, among processes of supplying the HCDS gas, supplying the TMB gas, and supplying the NH$_3$ gas, the C$_3$H$_6$ gas as a carbon-containing gas may be supplied to the wafer 200 in the process of supplying the TMB gas. Further, in the process of supplying the TMB gas, the C$_3$H$_6$ gas may be supplied in a period in which the TMB gas is supplied. As such, the TMB gas and the C$_3$H$_6$ gas are simultaneously supplied to the wafer 200.

Examples of FIGS. 9A and 9B illustrate that a set includes Steps 1a and 2a, and a cycle, in which the set is performed twice and Step 3b is then performed, is performed n times to form a SiBCN film having a borazine ring skeleton and containing a predetermined composition, which has a predetermined film thickness, on the wafer 200. The second film forming sequence has the same configurations as those of the first film forming sequence except that Steps 1b and 2b are set as one set, and after the set is performed a plurality of times, Step 3b is performed. The processing conditions in the second film forming sequence may also be the same as those in the first film forming sequence described above.

(Effects According to the Present Embodiment)

In the film forming sequences according to the present embodiment, the same effects as those of the first embodiment described above are provided. Further, according to the film forming sequences in the present embodiment, by performing Step 3b of supplying the NH$_3$ gas to the wafers 200, the composition ratio of the SiBCN film can be finely adjusted as described above.

Modified Example

Examples of the first and the second sequences shown in FIGS. 6 to 9B describe that the C$_3$H$_6$ gas is supplied in Step 2b in which the TMB gas is supplied, but the present embodiment is not limited to such examples. For example, the C$_3$H$_6$ gas may be supplied in Step 1b in which the HCDS gas is supplied. In addition, the C$_3$H$_6$ gas may be supplied in Step 3b in which the NH$_3$ gas is supplied. Further, the C$_3$H$_6$ gas may be supplied in all of Steps 1b to 3b.

In any examples, the same effects as those of the above embodiment can be achieved. However, supplying the C$_3$H$_6$ gas in Steps 2b and 3b may be preferred rather than supplying the C$_3$H$_6$ gas in Step 1b, since it is possible to avoid a gas phase reaction between the HCDS gas and the C$_3$H$_6$ gas in the process chamber 201, that is, it is possible to suppress the generation of particles in the process chamber 201. Supplying the C$_3$H$_6$ gas in Step 2b in which the TMB gas (serving as a carbon source) is supplied may be further preferred rather than supplying the C$_3$H$_6$ gas in Step 3b in which the NH$_3$ gas (serving as a nitrogen source) is supplied, since it is possible to better control the composition ratio of the SiBCN film.

Third Embodiment of the Present Disclosure

Hereinafter, a third embodiment of the present disclosure is described.

The first embodiment describes an example in which a SiBCN film having a borazine ring skeleton is formed on a substrate by performing a cycle including Step 1a and 2a a predetermined number of times. However, the present embodiment describes an example in which a SiBCN film having a borazine ring skeleton is formed on a substrate by performing a predetermined number of times a cycle including Step 2c of supplying the carbon-containing gas (e.g., C$_3$H$_6$ gas) to the substrate between Steps 1c and 3c which are performed in the same manner as Steps 1a and 2a.

Figure 11:
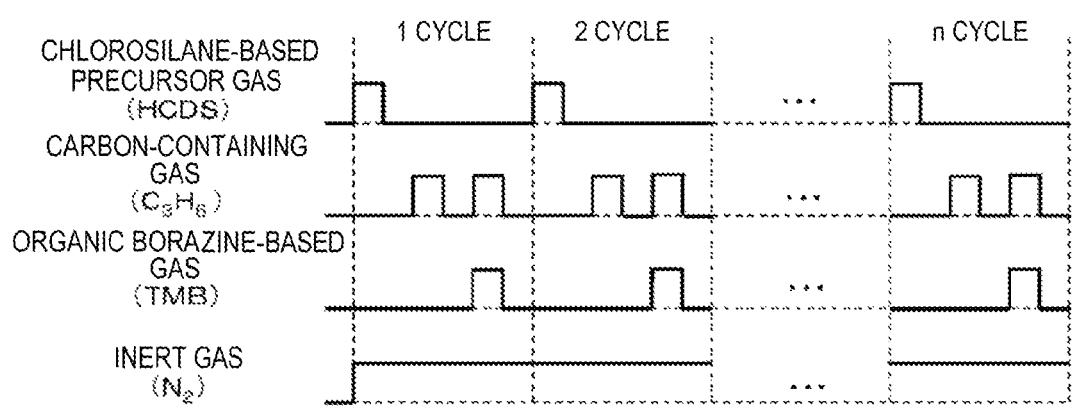
FIG. 11 illustrates a timing diagram for supplying gases in the film forming sequence according to the third embodiment of the present disclosure.

A film forming sequence of the present embodiment is described below in detail. FIG. 10 illustrates a flowchart of a method for film forming in the film forming sequence of the present embodiment. FIG. 11 illustrates a timing diagram for supplying gases in the film forming sequence of the present embodiment.

In the film forming sequence of the present embodiment, a SiBCN film having a borazine ring skeleton is formed on the wafer 200 by performing a cycle a predetermined number of times. The cycle includes: supplying HCDS gas as a chlorosilane-based precursor gas containing Si and Cl to the wafer 200; supplying C$_3$H$_6$ gas as a carbon-containing gas to the wafer 200; and supplying TMB gas as a reaction gas including an organic borazine compound to the wafer 200. The cycle is performed under a condition in which the borazine ring skeleton in the organic borazine compound is maintained Here, among processes of supplying the HCDS gas and supplying the TMB gas, the C$_3$H$_6$ gas as a carbon-containing gas is supplied to the wafer 200 in the process of supplying the TMB gas. Further, in the process of supplying the TMB gas, the C$_3$H$_6$ gas may be supplied in a period in which the TMB gas is supplied. As such, the TMB gas and the C$_3$H$_6$ gas may be simultaneously supplied to the wafer 200.

The film forming sequence of the present embodiment has the same configurations as those in the first embodiment except that Step 2c is performed between Steps 1c and 3c (which are performed in the same manner as Steps 1a and 2a) and thus a layer having a C-containing layer formed on the first layer is modified by causing the layer having the C-containing layer formed on the first layer to react with an organic borazine compound in step 3c performed in the same manner as Step 2a. Hereinafter, Steps 2c and 3c of the present embodiment are described.

[Step 2c]

(C$_3$H$_6$ Gas Supply)

After Step 1c is completed by removing the residual gas from the process chamber 201, the C$_3$H$_6$ gas is supplied into the process chamber 201 through the same procedure as in Step 2a of the first embodiment. In this case, the valve 243b of the second gas supply pipe 232b is in a close state and thus the TMB gas is not supplied into the process chamber 201.

During this operation, in order to prevent infiltration of the C$_3$H$_6$ gas into the first nozzle 249a, the second nozzle 249b, the third nozzle 249c, and the buffer chamber 237, the valves 243f, 243g, and 243h are opened to flow the N$_2$ gas into the first inert gas supply pipe 232f, the second inert gas supply pipe 232g, and the third inert gas supply pipe 232h. The N$_2$ gas is supplied into the process chamber 201 through the first gas supply pipe 232a, the second gas supply pipe 232b, the third gas supply pipe 232c, the first nozzle 249a, the second nozzle 249b, the third nozzle 249c, and the buffer chamber 237, and is exhausted through the exhaust pipe 231.

In this case, the APC valve 244 is appropriately adjusted such that the internal pressure of the process chamber 201 falls within a range of, for example, 1 to 6,000 Pa. The supply flow rate of the C$_3$H$_6$ gas controlled by the MFC 241d is set to fall within a range of, for example, 100 to 10,000 sccm. The supply flow rate of the N$_2$ gas controlled by each of the MFCs 241f to 241i is set to fall within a range of, for example, 100 to 10,000 sccm. Here, a partial pressure of the C$_3$H$_6$ gas in the process chamber 201 is set to fall within a range of, for example, 0.01 to 5,941 Pa. A time for supplying the C$_3$H$_6$ gas to the wafer 200, in other words, a gas supply time (i.e., an irradiation time), is set to fall within a range of, for example, 1 to 200 seconds, specifically, for example, 1 to 120 seconds, or more specifically, for example, 1 to 60 seconds. In this case, the temperature of the heater 207 is set such that the temperature of the wafers 200 falls within a range of, for example, 250 to 700 degrees C., specifically, for example, 300 to 650 degrees C., or more specifically, for example, 350 to 600 degrees C. in the same manner as described with respect to Step 1c. In addition, since the $C_3H_6$ gas activated by heat is supplied to generate a soft reaction, a C-containing layer described later can be formed easily.

In this case, the thermally activated $C_3H_6$ gas flows into the process chamber 201 while the HCDS gas does not flow into the process chamber 201. Thus, the $C_3H_6$ gas supplied in an active state onto the wafer 200 does not cause a gas phase reaction and a C-containing layer having a thickness of less than one atomic layer, i.e., a discontinuous C-containing layer, is formed on the Si-containing layer containing Cl as the first layer formed on the wafer 200 in Step 1c. Specifically, a layer containing Si, Cl, and C, i.e., a layer in which the C-containing layer is formed on the Si-containing layer containing Cl (hereinafter, referred to as a first layer with a C-containing layer formed thereon) is formed. Furthermore, in some cases, depending on conditions, a portion of the silicon-containing layer containing Cl reacts with the $C_3H_6$ gas and the Si-containing layer containing Cl may be modified (or carbonized) so that a silicon carbide layer containing Cl (i.e., a SiC layer containing Cl) is formed as a layer containing Si, Cl, and C.

The C-containing layer formed on the first layer (i.e., the Si-containing layer containing Cl) may be a C layer or a chemical adsorption layer of the carbon-containing gas (i.e., $C_3H_6$ gas), i.e., a chemical adsorption layer of a substance (e.g., $C_xH_y$) produced by decomposing $C_3H_6$. In this case, the C layer may need to be a discontinuous layer constituted by C. Further, the chemical adsorption layer of $C_xH_y$ may need to be a discontinuous chemical adsorption layer of $C_xH_y$ molecules. If the C-containing layer formed on the first layer is a continuous layer, for example, if the adsorption of $C_xH_y$ onto the first layer is saturated to form a continuous chemical adsorption layer of $C_xH_y$ on the first layer, a surface of the first layer is entirely covered with the chemical adsorption layer of $C_xH_y$. In such a case, Si and Cl do not exist on a surface of the first layer on which the C-containing layer is formed. As a result, it may be difficult to obtain a nitriding reaction of the first layer with the C-containing layer formed thereon, in Step 3c which will be described later. This is because under the processing conditions as described above, while the reaction gas including the organic borazine compound reacts with or is bonded to Cl and Si, the reaction gas including an organic borazine compound is hard to react with or to be bonded to C. In order to cause a desired nitriding reaction in Step 3c which will be described later, the adsorption state of $C_xH_y$ onto the Si-containing layer containing Cl needs to be unsaturated, and there is a need to expose Si and Cl to the surface of the first layer with the C-containing layer formed thereon.

Although the unsaturation of adsorption state of CxHy onto the first layer may be achieved under the above process conditions employed in Step 2c, it can be more easily achieved by changing the process conditions of Step 2c to the following process conditions.
Wafer temperature: 500 to 650 degrees C.
Internal pressure of process chamber: 133 to 5,332 Pa
Partial pressure of $C_3H_6$ gas: 33 to 5,177 Pa
Supply flow rate of $C_3H_6$ gas: 1000 to 10000 sccm
Supply flow rate of $N_2$ gas: 300 to 3000 sccm
Supply time of $C_3H_6$ gas: 6 to 200 seconds
(Residual Gas Removal)

After the C-containing layer is formed on the first layer, the valve 243d of the fourth gas supply pipe 232d is closed to stop the supply of the $C_3H_6$ gas. Thereafter, the residual $C_3H_6$ gas, which has not reacted or remains after contributing to the formation of the C-containing layer, and reaction byproducts remaining in the process chamber 201 are removed from the process chamber 201 through the same procedures as Step 2a of the first embodiment. Here, the interior of the process chamber 201 may incompletely be purged in the same manner as Step 2a of the first embodiment.

Examples of the carbon-containing gas may include hydrocarbon-based gases such as acetylene ($C_2H_2$) gas, ethylene ($C_2H_4$) gas and the like, in addition to the propylene ($C_3H_6$) gas. The carbon-containing gas acts as a carbon source. The use of a hydrocarbon-based gas as a carbon-containing gas easily controls a ratio of the C component of the SiBCN film to increase.

[Step 3c]
(TMB Gas and $C_3H_6$ Gas Supply)

After Step 2c is completed by removing the residual gas in the process chamber 201, Step 3c of supplying the TMB gas and the $C_3H_6$ gas to the wafers 200 is performed. Step 3c is performed in the same manner as Step 2a in the first embodiment.

By supplying the TMB gas to the wafer 200 under procedures and conditions similar to those of Step 2a, the first layer with the C-containing layer formed thereon, which has been formed on the wafer 200 in Step 2c, reacts with the TMB gas. Thus, the Cl (chloro group) existing on an exposed surface of the first layer with the C-containing layer formed thereon may react with the ligand (i.e., methyl group) in the TMB gas. The above reaction is the same as the reaction between the first layer and the TMB gas occurring in Step 2a of the first embodiment.

Further, since the $C_3H_6$ gas is supplied in a process of supplying the TMB gas, specifically, the $C_3H_6$ gas is supplied in a period in which the TMB gas is supplied, the C component in the $C_3H_6$ gas is also newly introduced into the first layer with the C-containing layer formed thereon. The reaction occurring here is the same as the reaction between the first layer and the $C_3H_6$ gas in Step 2a of the first embodiment.

The borazine ring is newly introduced into the first layer with the C-containing layer formed thereon by a series of the above reactions, and the first layer with the C-containing layer formed thereon is changed (or modified) into a second layer having a borazine ring skeleton and containing Si, B, C, and N, in other words, a SiBCN layer having a borazine ring skeleton. The second layer is a layer having a thickness of a range, for example, from less than one atomic layer to several atomic layers. In the same manner as Step 2a of the first embodiment, the B component, the N component, and the C component constituting the borazine ring are newly introduced into the first layer with the C-containing layer formed thereon, and the C component in the $C_3H_6$ gas is also newly incorporated. As a result, the second layer becomes a C-rich layer, as compared with a layer obtained by modifying the first layer without supplying the $C_3H_6$ gas to the wafer 200. Furthermore, in the same manner as Step 2a of the first embodiment, the second layer becomes a layer with fewer impurities such as Cl or a porous layer.

(Residual Gas Removal)

Subsequently, the residual TMB gas, which has not reacted or remains after contributing to the reaction, and reaction byproducts remaining in the process chamber 201 are removed from the process chamber 201 through the same procedures and conditions as those in Step 2a of the first embodiment (i.e., residual gas removal). Here, the residual gas remaining in the interior of the process chamber 201 may incompletely be removed and the interior of the process chamber 201 may incompletely be purged, in the same manner as that in Step 2a of the first embodiment.

(Performing Predetermined Number of Times)

A cycle in which Steps 1c to 3c are performed may be set as one cycle and the cycle may be performed one or more times (e.g., a predetermined number of times) to form on the wafer 200 the SiBCN film having a borazine ring skeleton and containing a predetermined composition, which has a predetermined film thickness. Further, it may be preferred that the above cycle is repeated a plurality of times. Thus, a thickness of the SiBCN layer formed per cycle may be set to be smaller than a desired film thickness and the above cycle may be repeated a plurality of times until the desired film thickness is obtained.

(Effects According to the Present Embodiment)

In the film forming sequence according to the present embodiment, the same effects as those of the first embodiment described above can be achieved. Further, according to the film forming sequence in the present embodiment, by performing Step 2c of supplying the $C_3H_6$ gas to the wafers 200 after performing Step 1c for forming the first layer on the wafer 200, a ratio of the C component of the SiBCN film can be easily controlled to increase.

Fourth Embodiment of the Present Disclosure

Hereinafter, a fourth embodiment of the present disclosure is described.

The first embodiment describes examples in which a SiBCN film having a borazine ring skeleton is formed on a substrate by performing a cycle including Steps 1a and 2a a predetermined number of times. However, the present embodiment describes examples below in which a SiBCN film having a borazine ring skeleton is formed on a substrate by performing a predetermined number of times a cycle including Step 3d of supplying a gas containing N and C (e.g., TEA gas) to the substrate in addition to Steps 1d and 2d which are performed in the same manner as Steps 1a and 2a.

(First Sequence)

Figure 12:
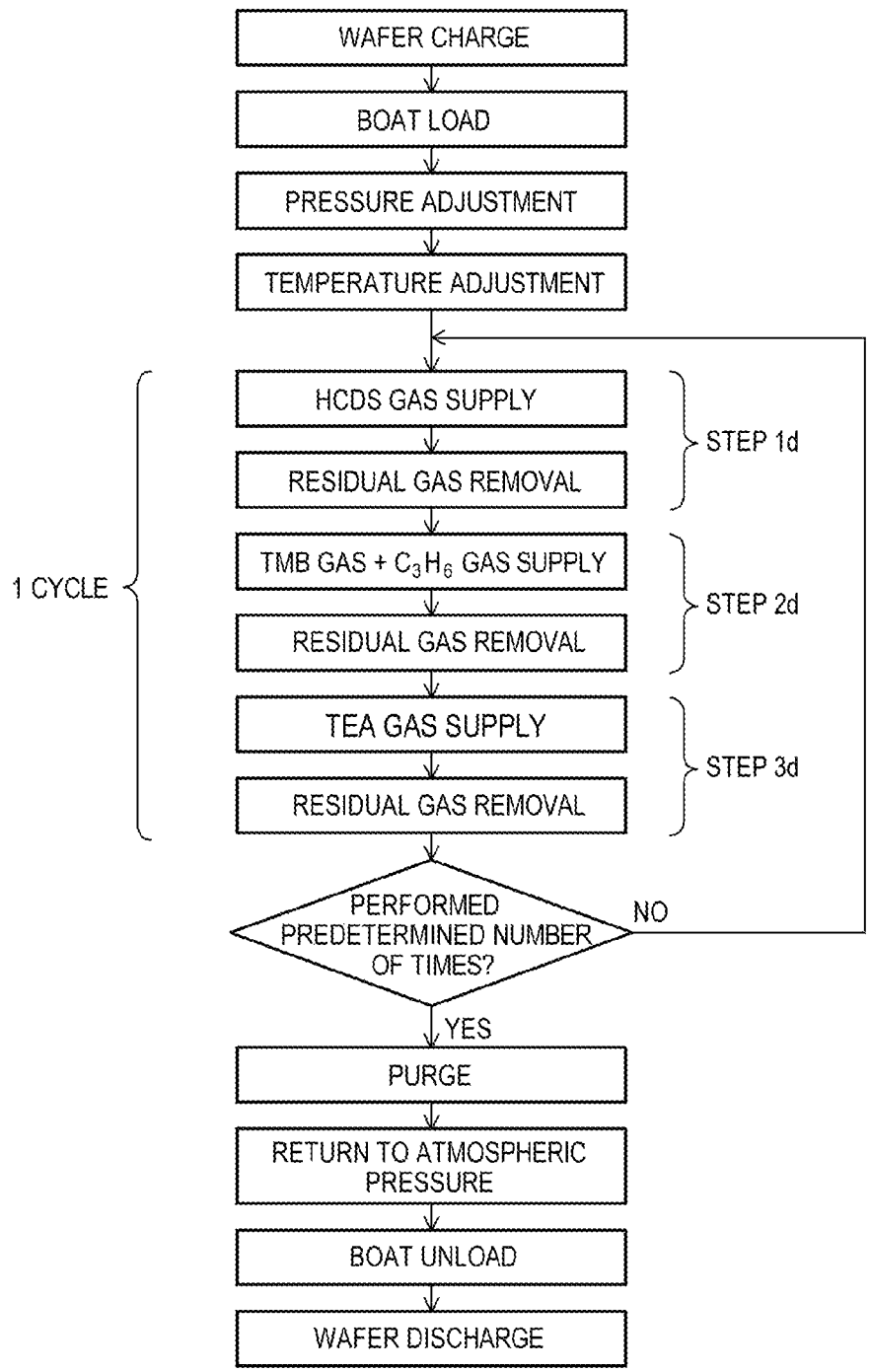
FIG. 12 illustrates a flowchart of a method for film forming in a first film forming sequence according to a fourth embodiment of the present disclosure.
Figure 13A:
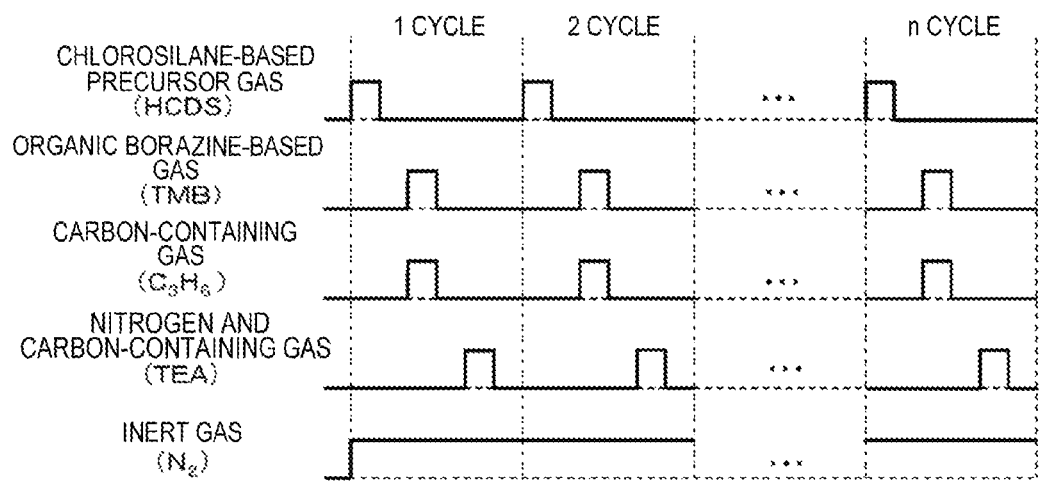
FIG. 13A illustrates a timing diagram for supplying gases in the first film forming sequence according to the fourth embodiment of the present disclosure.

A first film forming sequence of the present embodiment is described later. FIG. 12 illustrates a flowchart of a method for film forming in the first film forming sequence of the present embodiment. FIG. 13A illustrates a timing diagram for supplying gases in the first film forming sequence of the present embodiment.

In the first sequence of the present embodiment, a SiBCN film having a borazine ring skeleton is formed on the wafer 200 by performing a cycle a predetermined number of times. The cycle includes: supplying HCDS gas as chlorosilane-based precursor gas containing Si and Cl to the wafer 200; supplying TMB gas as a reaction gas including an organic borazine compound to the wafer 200; and supplying TEA gas as gas containing N and C to the wafer 200. The cycle is performed under a condition in which the borazine ring skeleton in the organic borazine compound is maintained.

Here, among processes of supplying the HCDS gas, supplying the TMB gas, and supplying the $NH_3$ gas, the $C_3H_6$ gas as a carbon-containing gas is supplied to the wafer 200 in the process of supplying the TMB gas. Further, in the process of supplying the TMB gas, the $C_3H_6$ gas may be supplied in a period in which the TMB gas is supplied. As such, the TMB gas and the $C_3H_6$ gas may be simultaneously supplied to the wafer 200.

The first film forming sequence of the present embodiment has the same configurations as those of the film forming sequence of the first embodiment except that the former further includes Step 3d, in addition to Steps 1d and 2d performed in the same manner as Steps 1a and 2a. Hereinafter, Step 3d in the present embodiment is described.

[Step 3d]

(TEA Gas Supply)

After Step 2d is completed by removing the residual gas in the process chamber 201, the valve 243e of the fifth gas supply pipe 232e is opened to flow the TEA gas into the fifth gas supply pipe 232e. A flow rate of the TEA gas flowing into the fifth gas supply pipe 232e is adjusted by the MFC 241e. The flow rate-adjusted TEA gas flows in the fourth gas supply pipe 232d and supplied into the process chamber 201 through the gas supply holes 250d of the fourth nozzle 249d. The TEA gas supplied into the process chamber 201 is excited (or activated) by heat and exhausted through the exhaust pipe 231. As such, the TEA gas excited by heat is supplied to the wafers 200. In addition, the valve 243i is opened to flow the $N_2$ gas into the fourth inert gas supply pipe 232i. The $N_2$ gas flowing in the fourth inert gas supply pipe 232i is supplied into the process chamber 201, together with the TEA gas, and exhausted through the exhaust pipe 231.

During this operation, in order to prevent infiltration of the TEA gas into the first nozzle 249a, the second nozzle 249b, the third nozzle 249c, and the buffer chamber 237, the valves 243f, 243g, and 243h are opened to flow the $N_2$ gas into the first inert gas supply pipe 232f, the second inert gas supply pipe 232g, and the third inert gas supply pipe 232h. The $N_2$ gas is supplied into the process chamber 201 through the first gas supply pipe 232a, the second gas supply pipe 232b, the third gas supply pipe 232c, the first nozzle 249a, the second nozzle 249b, the third nozzle 249c, and the buffer chamber 237, and exhausted through the exhaust pipe 231.

In this case, the APC valve 244 is appropriately adjusted such that the internal pressure of the process chamber 201 falls within a range of, for example, 1 to 6,000 Pa. The supply flow rate of the TEA gas controlled by the MFC 241e is set to fall within a range of, for example, 100 to 10,000 sccm. The supply flow rate of the $N_2$ gas controlled by each of the MFCs 241f to 241i is set to fall within a range of, for example, 100 to 10,000 sccm. Here, a partial pressure of the TEA gas in the process chamber 201 is set to fall within a range of, for example, 0.01 to 5,941 Pa. A time for supplying the TEA gas to the wafer 200, in other words, a gas supply time (i.e., an irradiation time), is set to fall within a range of, for example, 1 to 200 seconds, specifically, for example, 1 to 120 seconds, or more specifically, for example, 1 to 60 seconds. In this case, the temperature of the heater 207 is set such that the temperature of the wafers 200 falls within, for example, a range of 250 to 700 degrees C., specifically, 300 to 650 degrees C., more specifically, 350 to 600 degrees C., in the same manner as described with respect to Step 1d.

Here, the thermally activated TEA gas flows into the process chamber 201, while none of the HCDS gas, the TMB gas, and the $C_3H_6$ gas flows into the process chamber 201. Accordingly, the TEA gas does not cause a gas phase reaction, and the activated TEA gas reacts with at least a portion of the second layer having a borazine ring skeleton and containing Si, B, C, and N formed on the wafer 200 in Step 2d. Thus, the second layer is modified into a third layer having a borazine ring skeleton and containing Si, B, C, and N (i.e., SiBCN layer). The third layer is a layer having a thickness of a range, for example, from less than one atomic layer to several atomic layers. A composition ratio of the third layer is different from a composition ratio of the second layer. For example, a C concentration of the third layer may be higher than that of the second layer.

In the process of forming the third layer, the second layer is modified by the reaction with the TEA gas under the conditions in which the borazine ring skeleton in the second layer is maintained. Specifically, the B component and the C component of the second layer after the modification (i.e., the third layer) are increased by adding N and C in the TEA gas to the second layer. In this case, the borazine ring skeleton constituting the borazine ring in the second layer is maintained without being broken. Also, by flowing the TEA gas which is activated by heat into the process chamber 201, the desorption (or extraction) of the C component from the second layer may be alleviated and thus a ratio of the C component of the third layer may be easily controlled to increase.

When the TEA gas is supplied under the above-described conditions, the second layer can properly react with the TEA gas while maintaining the borazine ring skeleton in the second layer without being broken, thereby causing the above-described reaction. In addition, it is believed that the most important factors (or conditions) for causing this reaction, with the borazine ring skeleton in the second layer maintained, are considered the temperature of the wafers 200 and the internal pressure of the process chamber 201, particularly, the temperature of the wafers 200. Thus, it is possible to cause suitable reactions by appropriately controlling the factors.

(Residual Gas Removal)

After the third layer is formed, the valve 243e of the fifth gas supply pipe 232e is closed to stop the supply of the TEA gas. At this time, while the APC valve 244 of the exhaust pipe 231 is in an open state, the interior of the process chamber 201 is vacuum-exhausted by the vacuum pump 246 to remove from the process chamber 201 the residual TEA gas, which has not reacted or remains after contributing to the formation of the third layer, and reaction byproducts remaining in the process chamber 201 (i.e., residual gas removal). In this operation, the supply of the $N_2$ gas as an inert gas into the process chamber 201 is maintained by keeping the valves 243f to 243i in an open state. The $N_2$ gas acts as a purge gas so as to enhance the effect of removing from the process chamber 201 the residual TEA gas, which has not reacted or remains after contributing to the formation of the third layer, and reaction byproducts remaining in the process chamber 201.

In this case, the residual gas remaining in the process chamber 201 may incompletely be removed and the interior of the process chamber 201 may incompletely be purged. When the gas remaining in the process chamber 201 is very small in amount, there is no adverse effect to be generated in a following Step 1d. Here, an amount of the $N_2$ gas supplied into the process chamber 201 need not be a large amount. For example, approximately the same amount of the $N_2$ gas as the volume of the reaction tube 203 (or the process chamber 201) may be supplied to perform the purge such that there is no adverse effect to be generated in Step 1d. As described above, as the interior of the process chamber 201 is purged incompletely, the purge time can be reduced and thus the throughput can be improved. In addition, the consumption of the $N_2$ gas can also be suppressed to a minimal necessity.

Examples of the amine-based gas may include ethylamine-based gases obtained by vaporizing diethylamine (($C_2H_5$)$_2$NH, abbreviation: DEA), monoethylamine ($C_2H_5NH_2$, abbreviation: MEA) and the like, methylamine-based gases obtained by vaporizing trimethylamine (($CH_3$)$_3$N, abbreviation: TMA), dimethylamine (($CH_3$)$_2$NH, abbreviation: DMA), monomethylamine ($CH_3NH_2$, abbreviation: MMA) and the like, propylamine-based gases obtained by vaporizing tripropylamine (($C_3H_7$)$_3$N, abbreviation: TPA), dipropylamine (($C_3H_7$)$_2$NH, abbreviation: DPA), monopropylamine ($C_3H_7NH_2$, abbreviation: MPA) and the like, isopropyl amine-based gases obtained by vaporizing triisopropylamine ([($CH_3$)$_2$CH]$_3$N, abbreviation: TIPA), diisopropylamine ([($CH_3$)$_2$CH]$_2$NH, abbreviation: DIPA), monoisopropylamine (($CH_3$)$_2$CHNH$_2$, abbreviation: MIPA) and the like, butylamine-based gases obtained by vaporizing tributylamine ($C_4H_9$)$_3$N, abbreviation: TBA), dibutylamine (($C_4H_9$)$_2$NH, abbreviation: DBA), monobutylamine ($C_4H_9NH_2$, abbreviation: MBA) and the like, and isobutylamine-based gases obtained by vaporizing triisobutylamine ([($CH_3$)$_2$CHCH$_2$]$_3$N, abbreviation: TIBA), diisobutylamine ([($CH_3$)$_2$CHCH$_2$]$_2$NH, abbreviation: DIBA), monoisobutylamine (($CH_3$)$_2$CHCH$_2$NH$_2$, abbreviation: MIBA) and the like, in addition to triethylamine (($C_2H_5$)$_3$N, abbreviation: TEA). As such, at least one kind of gas, for example, $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (in the chemical formula, x is an integer from 1 to 3) may be used as the amine-based gas.

The amine-based gas acts as a carbon source as well as a nitrogen source. The use of the amine-based gas as the gas containing N and C may allow an easy control of any one of ratios of the C component and the N component in the SiBCN film, especially, the ratio of the C component to increase.

Furthermore, examples of the gas containing N and C may include a gas including an organic hydrazine compound, that is, an organic hydrazine-based gas, in addition to the amine-based gas. The organic hydrazine-based gas is a gas that has a hydrazine group, such as a gas obtained by vaporizing organic hydrazine, and contains C, N, and H. That is, the organic hydrazine-based gas is a gas containing no Si, and a gas containing no Si and metal. Examples of the organic hydrazine-based gas may include methyl hydrazine-based gases obtained by vaporizing monomethylhydrazine (($CH_3$)HN$_2$H$_2$, abbreviation: MMH), dimethylhydrazine (($CH_3$)$_2$N$_2$H$_2$, abbreviation: DMH), trimethylhydrazine (($CH_3$)$_2$N$_2$ ($CH_3$)H, abbreviation; TMH) and the like, and ethyl hydrazine-based gases obtained by vaporizing ethylhydrazine (($C_2H_5$)HN$_2$H$_2$, abbreviation: EH) and the like. When organic hydrazine in a liquid state under normal temperature and pressure such as MMH is used, the organic hydrazine in the liquid state may be vaporized by a vaporization system such as a vaporizer, a bubbler, or the like, and supplied as the organic hydrazine-based gas, i.e., the gas containing N and C (e.g., MMH gas). The gas including an organic hydrazine compound may also be simply referred to as an organic hydrazine compound gas or an organic hydrazine gas.

(Performing Predetermined Number of Times)

A cycle in which Steps 1d to 3d are performed may be set as one cycle and the cycle may be performed one or more times (e.g., predetermined number of times) to form a SiBCN film having a borazine ring skeleton and containing a predetermined composition, which has a predetermined film thickness, on the wafer 200. Further, it may be preferred that the above cycle be repeated a plurality of times. Thus, a thickness of the SiBCN layer formed per cycle may be set to be smaller than a desired film thickness and the above cycle may be repeated a plurality of times until the desired film thickness is obtained.

(Second Sequence)

Figure 14:
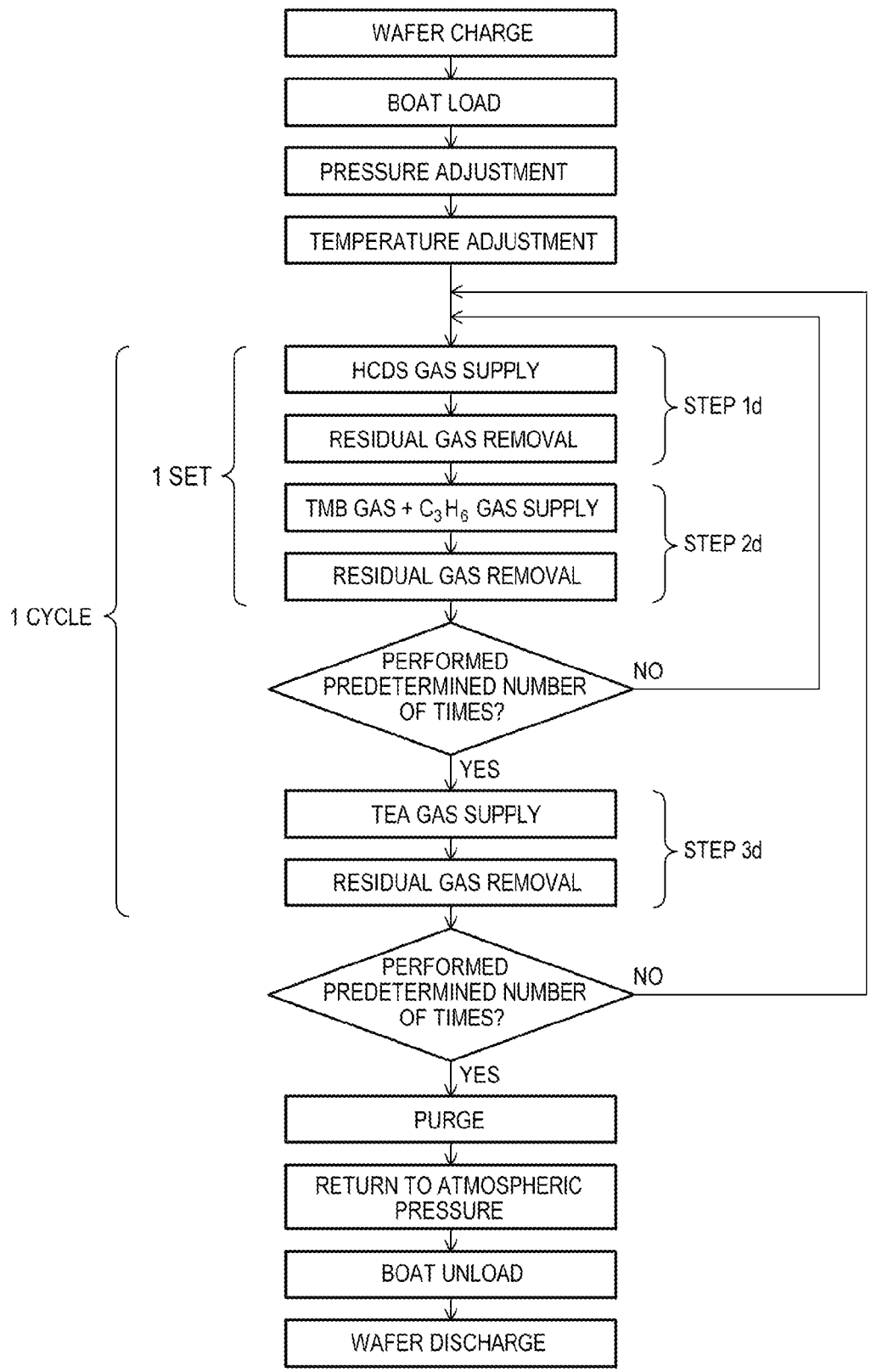
FIG. 14 illustrates a flowchart of a method for film forming in a second film forming sequence according to the fourth embodiment of the present disclosure.
Figure 15A:
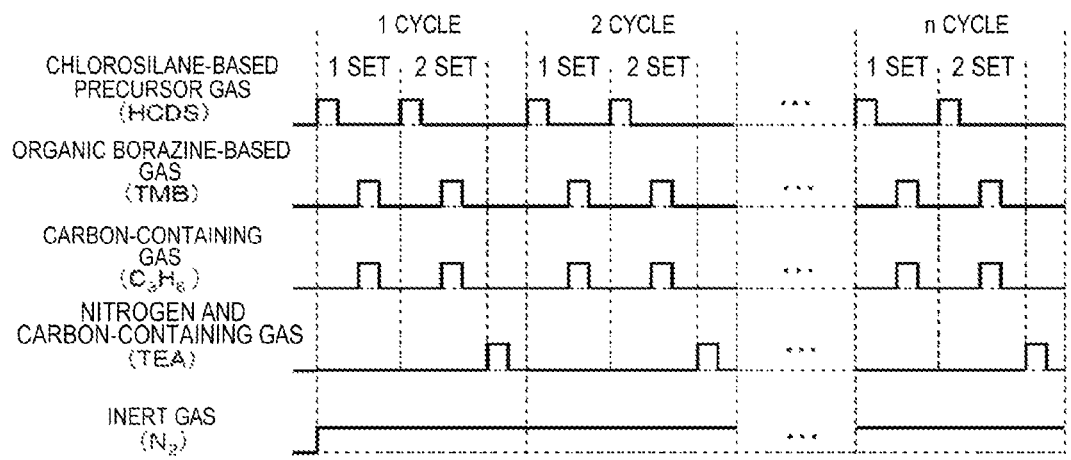
FIG. 15A illustrates a timing diagram for supplying gases in the second film forming sequence according to the fourth embodiment of the present disclosure.

A second film forming sequence of the present embodiment is described later. FIG. 14 illustrates a flowchart of a method for film forming in the second film forming sequence of the present embodiment. FIG. 15A illustrates a timing diagram for supplying gases in the second film forming sequence of the present embodiment.

In the second sequence of the embodiment, a SiBCN film having a borazine ring skeleton is formed on the wafer 200 by performing a cycle a predetermined number of times. The cycle includes: alternately performing a predetermined number of times supplying HCDS gas as a chlorosilane-based precursor gas containing Si and Cl to the wafer 200, and supplying TMB gas as a reaction gas including an organic borazine compound to the wafer 200; and supplying TEA gas as nitriding gas to the wafer 200. The cycle is performed under a condition in which the borazine ring skeleton in an organic borazine compound is maintained.

Here, among processes of supplying the HCDS gas, supplying the TMB gas, and supplying the $NH_3$ gas, the $C_3H_6$ gas as a carbon-containing gas is supplied to the wafer 200 in the process of supplying the TMB gas. Further, in the process of supplying the TMB gas, the $C_3H_6$ gas may be supplied in a period in which the TMB gas is supplied. As such, the TMB gas and the $C_3H_6$ gas may be simultaneously supplied to the wafer 200.

Examples of FIG. 15A illustrate that a set includes Steps 1b and 2b, and a cycle, in which the set is performed twice and Step 3b is then performed, is performed n times to form a SiBCN film having a borazine ring skeleton and containing a predetermined composition, which has a predetermined film thickness, on the wafer 200, The second film forming sequence has the same configuration as those of the first film forming sequence except that Steps 1d and 2d are set as one set, and after the set is performed a plurality of times, Step 3d is performed. The processing conditions in the second film forming sequence may also be the same as those in the first film forming sequence described above.

(Effects According to the Present Embodiment)

In the film forming sequence according to the present embodiment, the same effects as those of the embodiment described above are provided. Further, according to the film forming sequences in the present embodiment, by performing Step 3d to add N and C in the TEA gas to the second layer, it is possible to form a SiBCN film in which any one of ratios of the N component and the C component increases. Also, by supplying the TEA gas activated by heat (not by plasma), the desorption (or extraction) of the C component from the second layer can be alleviated and thus a ratio of the C component of the SiBCN film can be controlled to increase.

Modified Example 1

Figure 13B:
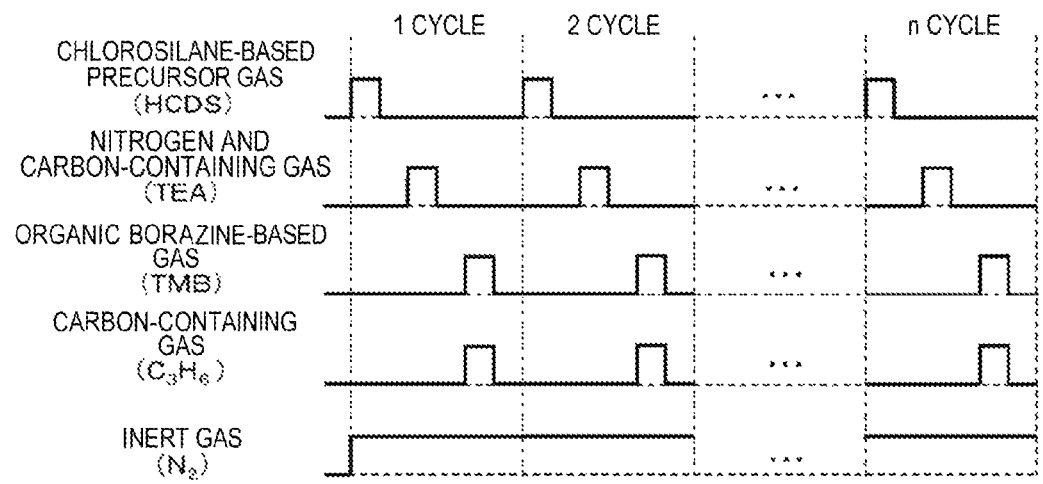
FIG. 13B illustrates a modified timing diagram for supplying gases in the first film forming sequence according to the fourth embodiment of the present disclosure.
Figure 15B:
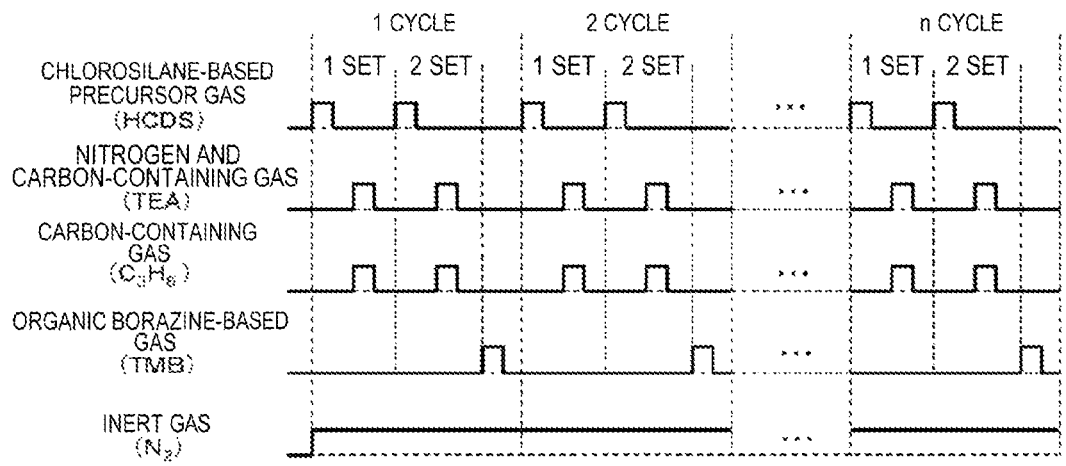
FIG. 15B illustrates a modified timing diagram for supplying gases in the second film forming sequence according to the fourth embodiment of the present disclosure.

The first and the second sequences as described above illustrate examples in which Step 3d of supplying the TEA gas is performed after Step 2d of supplying the TMB gas is performed, but the present disclosure is not limited to such examples. Specifically, Step 3d may be performed prior to Step 2d. An example of FIG. 13B illustrates that a cycle in which Steps 1d, 3d, and 2d are performed in that order is set as one cycle and the cycle is performed one or more times (e.g., a predetermined number of times). In addition, an example of FIG. 15B illustrates that a set includes Steps 1d and 3d, and a cycle, in which the set is repeated a predetermined number of times and Step 2d is then performed, is performed a predetermined number of times. In addition, the example of FIG. 15B shows that the $C_3H_6$ gas is supplied in Step 3d rather than Step 2d so that the TEA gas and the $C_3H_6$ gas are supplied simultaneously.

Further, by performing Steps 3d after Step 1d, the first layer (i.e., Si-containing layer containing Cl) formed in Step 1d reacts with the TEA gas. Thus, the first layer (i.e., Si-containing layer containing Cl) is changed (or modified) into a layer containing Si, Cl, C, and N (i.e., SiCN layer containing Cl). The SiCN layer containing Cl becomes a layer containing Si, Cl, C, and N having a thickness of a range, for example, from less than one atomic layer to several atomic layers. The SiCN layer containing Cl becomes a layer in which the ratio of the Si component and the ratio of the C component are relatively large, that is, a Si-rich and C-rich layer.

Further, by performing Step 2d after Step 3d, the SiCN layer containing Cl formed in Step 3d reacts with the TMB gas. Thus, the SiCN layer containing Cl is changed (or modified) into a second layer having a borazine ring skeleton and including Si, B, C, and N, i.e., a silicon borocarbonitride layer (SiBCN layer) having a borazine ring skeleton.

Thus, when a cycle in which Steps 1d, 3d, and 2d are performed in that order is set to one cycle, the cycle may be performed a predetermined number of times, or when a set includes Steps 1d and 3d and a cycle, in which the set is repeated a plurality of times and Step 2d is then performed, is set to one cycle, the cycle may be performed a predetermined number of times. Accordingly, it is possible to form a SiBCN film having a borazine ring skeleton having a predetermined composition and a predetermined thickness on the wafer 200.

Modified Example 2

In the first and second sequences as described above with respect to FIGS. 12 to 15, an example is described in which the $C_3H_6$ gas is supplied in Step 2d of supplying the TMB gas, and an example is described in which the $C_3H_6$ gas is supplied in Step 3d of supplying the TEA gas, but the present embodiment is not limited thereto. For example, the $C_3H_6$ gas may be supplied in Step 1b of supplying the HCDS gas. Further, the $C_3H_6$ gas may be supplied in all of Steps 1b to 3b.

In any examples, the same effects as those of the above described embodiments can be achieved. However, supplying the $C_3H_6$ gas in Steps 2d and 3d may be preferable rather than supplying the $C_3H_6$ gas in Step 1d, since it is possible to avoid gas phase reaction between the HCDS gas and the $C_3H_6$ gas in the process chamber 201, that is, it is possible to suppress the generation of particles in the process chamber 201. In addition, supplying the $C_3H_6$ gas in Step 2d of supplying the TMB gas also serving as the carbon source may be preferred rather than supplying the $C_3H_6$ gas in Step 3d of supplying the $NH_3$ gas as the nitrogen source, since it is possible to increase the control of the composition ratio control of the SiBCN film.

Additional Embodiments of the Present Disclosure

Hereinabove, various embodiments of the present disclosure have been specifically described, but the present disclosure is not limited to the above-described embodiments, and may be variously modified without departing from the spirit of the present disclosure.

Figure 17:
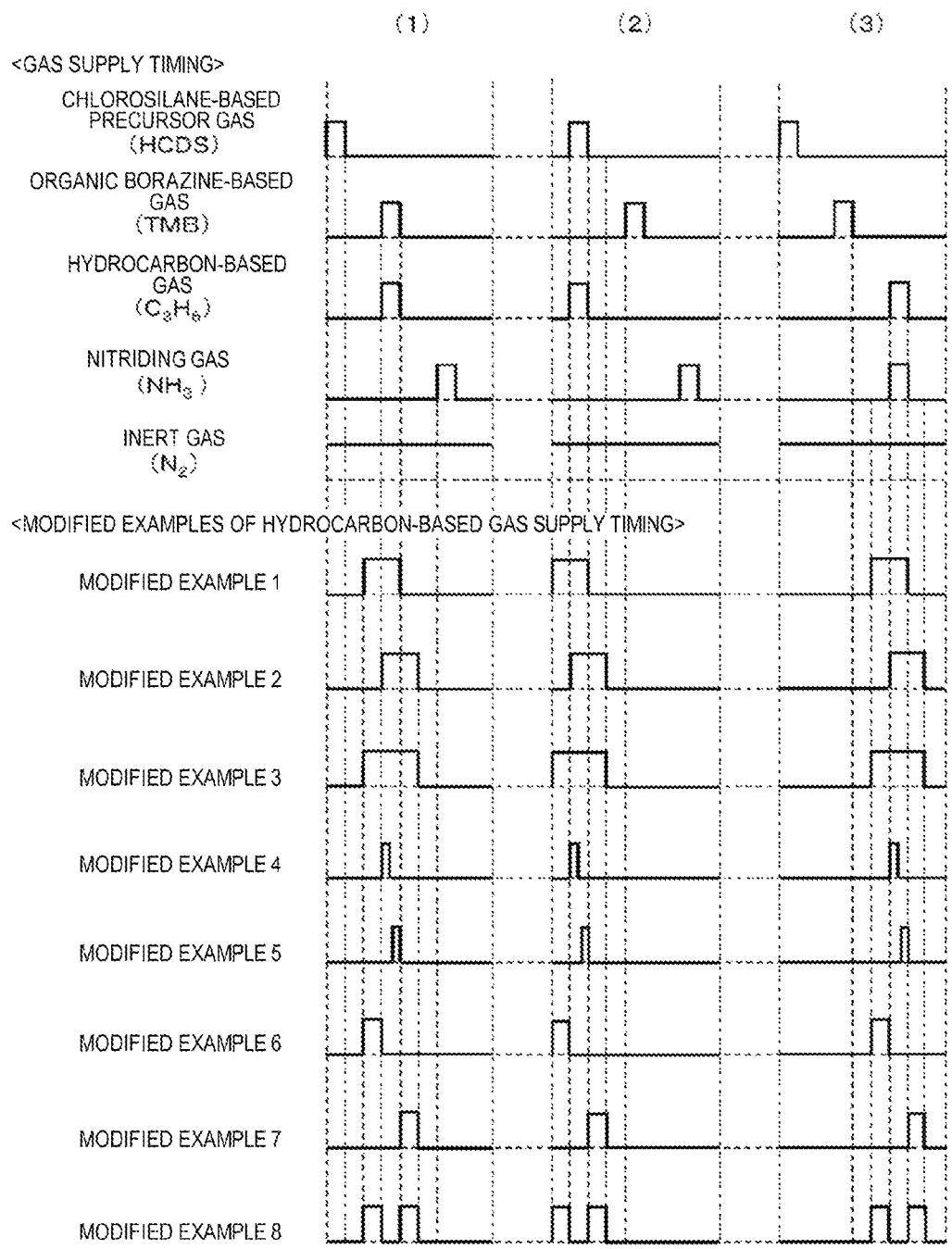
FIG. 17 illustrates a gas timing diagram for supplying a carbon-containing gas and modified examples in a film forming sequence according to one embodiment of the present disclosure.

For example, in the film forming sequences of the embodiments as described above, an example is described in which supplying $C_3H_6$ gas is primarily performed simultaneously in a supply period of the TMB gas but not performed in a supply halt period of the TMB gas. However, the film forming sequence according to the present embodiment is not limited thereto, and may be modified as shown in FIG. 17. Furthermore, FIG. 17 illustrates gas timing diagrams for supplying the $C_3H_6$ gas which are modified, for example, based on the film forming sequence of FIG. 7A.

For example, when the $C_3H_6$ gas is supplied in the process of supplying the TMB gas, as illustrated in section (1) of Modified Examples 1 to 3 in FIG. 17, the $C_3H_6$ gas may be supplied in a period of supplying the TMB gas, and may also be supplied in a period before supplying the TMB gas has begun, in a period after supplying the TMB gas has ended, or in both the periods. Further, as illustrated in Modified Example 4 and 5, the $C_3H_6$ gas may be supplied only in a portion of the period of supplying the TMB gas. Further, as illustrated in Modified Examples 6 to 8, the $C_3H_6$ gas may be supplied in the period before supplying the TMB gas has begun, in the period after supplying the TME gas has ended, or in both the periods, rather than during the period of supplying the TMB gas.

Further, for example, when the $C_3H_6$ gas is supplied in the process of supplying the HCDS gas, as illustrated section (2) of Modified Examples 1 to 3 in FIG. 17, the $C_3H_6$ gas may be supplied in a period of supplying the HCDS gas, and may also be supplied in a period before supplying the HCDS gas has begun, in a period after supplying the HCDS gas has ended, or during in both the periods. Further, as illustrated in Modified Example 4 and 5, the $C_3H_6$ gas may be supplied only in a portion of the period of supplying the HCDS gas. Further, as illustrated in Modified Examples 6 to 8, $C_3H_6$ gas may be supplied in the period before supplying the HCDS gas has begun, in the period after supplying the HCDS gas has ended, or in both the periods, rather than in the period of supplying the HCDS gas.

Furthermore, for example, when the $C_3H_6$ gas is supplied, in the process of supplying the $NH_3$ gas, as illustrated in section (3) in Modified Examples 1 to 3 in FIG. 17, the $C_3H_6$ gas may be supplied in a period of supplying the $NH_3$ gas, and may also be performed in a period before supplying the $NH_3$ gas has begun, in a period after supplying the $NH_3$ gas has ended, or in both the periods. Further, as illustrated in Modified Example 4 and 5, the $C_3H_6$ gas may be supplied only in a portion of the period of supplying the $NH_3$ gas. Further, as illustrated in Modified Examples 6 to 8, the $C_3H_6$ gas may be supplied in the period before supplying the $NH_3$ gas has begun, in the period after supplying the $NH_3$ gas has ended, or in both the periods, rather than the period of supplying the $NH_3$ gas. Furthermore, the same applies to a case in which the $C_3H_6$ gas is supplied in the process of supplying the TEA gas.

Thus, although the $C_3H_6$ gas may be supplied in the supply halt period of the TMB gas or the like, as well as the supply period of the TMB gas or the like, or may be supplied in the supply halt period of the TMB gas or the like rather than the supply period of the TMB gas or the like, the same effects as those of the above-described embodiments can be achieved.

Furthermore, in these Modified Examples, it is possible to finely adjust the C concentration in the SiBCN film, by appropriately controlling the gas supply conditions (e.g., a supply time of gas, a supply flow rate, an internal pressure of the process chamber 201, a partial pressure of the $C_3H_6$ gas or the like) when the $C_3H_6$ gas is supplied in the supply period and/or the supply halt period of the TMB gas or the like. For example, if an internal pressure of the process chamber 201 (otherwise, a supply flow rate or a partial pressure of the $C_3H_6$ gas) when the $C_3H_6$ gas is supplied in the supply halt period of the TMB gas is set to be greater than an internal pressure of the process chamber 201 (otherwise, a supply flow rate or an internal pressure of the TMB gas) in the supply period of the TMB gas, it is possible to further increase the C concentration of the SiBCN film. Further, if the supply time of the $C_3H_6$ gas in the supply halt period of the TMB gas is set to be longer than the supply time of the TMB gas in the supply period of the TMB gas, it is possible to further increase the C concentration of the SiBCN film. Also, for example, if the internal pressure of the process chamber 201 (otherwise, a supply flow rate or a partial pressure of the $C_3H_6$ gas) when the $C_3H_6$ gas is supplied in the supply halt period of the TMB gas is set to be lower than an internal pressure of the process chamber 201 (otherwise, a supply flow rate or an internal pressure of the TMB gas) in the supply period of the TMB gas, it is possible to appropriately suppress the increase of the C concentration of the SiBCN film. Further, if the supply time of the $C_3H_6$ gas in the supply halt period of the TMB gas is set to be shorter than the supply time of the TMB gas in the supply period of the TMB gas, it is possible to appropriately suppress the increase of the C concentration of the SiBCN film.

According to these Modified Examples, it is possible to increase the C concentration of the SiBCN film, without an excessively high internal pressure of the process chamber 201 in the supply period of the TMB gas, an excessively long supply time of the TMB gas, and an excessively high supply flow rate of the TMB gas. In other words, if the supply conditions (e.g., a supply time of the gas, a supply flow rate, an internal pressure of the process chamber 201, a partial pressure of the $C_3H_6$ gas, and the like) when the $C_3H_6$ gas is supplied in the supply halt period of the TMB gas are appropriately controlled, while setting the supply conditions (e.g., a supply time of the gas, a supply flow rate, an internal pressure of the process chamber 201, a partial pressure of the TMB gas, and the like) in the supply period of the TMB gas, it is possible to increase the C concentration of the SiBCN film. Furthermore, since it is possible to reduce the consumption of relatively expensive TMB gas, the substrate processing costs can be reduced.

Further, for example, in the above-described embodiments, an example of using a chlorosilane-based precursor gas in forming the first layer in each sequence has been described, but a silane-based precursor gas with a halogen-based ligand other than a chloro group may be used instead of the chlorosilane-based precursor gas. For example, a fluorosilane-based precursor gas may be used instead of the chlorosilane-based precursor gas. Here, the fluorosilane-based precursor gas refers to a fluorosilane-based precursor in a gaseous state, for example, a gas which is obtained by vaporizing a fluorosilane-based precursor in a liquid state under normal temperature and pressure, a fluorosilane-based precursor which is in a gaseous state under normal temperature and normal pressure, and the like. In addition, the fluorosilane-based precursor refers to a silane-based precursor having a fluoro group as a halogen group, and also refers to a precursor containing at least silicon (Si) and fluorine (F). As such, the fluorosilane-based precursor may refer to a kind of halide. Further, examples of a fluorosilane-based precursor gas may include silicon fluoride gases such as tetrafluorosilane, i.e., silicon tetrafluoride ($SiF_4$) gas, hexafluorodisilane ($Si_2F_6$) gas, and the like. In this case, in forming the first layer in each sequence, the fluorosilane-based precursor gas is supplied to the wafer 200. In this case, the first layer becomes a layer containing Si and F, that is, the Si-containing layer containing F.

In addition, as the SiBCN film formed according to the above-described embodiments may be used as a side wall spacer, a device forming technique having a small leak current and good machinability can be provided.

Also, as the SiBCN film formed by the method according to the above-described embodiments may be used as an etching stopper layer, a device forming technique having good machinability can be provided.

According to the above-described embodiments, a SiBCN film of an ideal stoichiometric ratio can be formed without using plasma even in a low temperature region. In addition, since such a SiBCN film can be formed without using plasma, for example, application to a process having probability of a plasma damage, for example, an SADP film of DPT, is also possible.

In addition, in the above-described embodiments, while an example is described in which a Si-based insulating film (e.g., SiBCN film) containing Si as a semiconductor element is formed as a borocarbonitride film, but the present disclosure may be applied to a case of forming a metal-based thin film containing a metal element such as a titanium borocarbonitride film (TiBCN film), a zirconium borocarbonitride film (ZrBCN film), a hafnium borocarbonitride film (HfBCN film), a tantalum borocarbonitride film (TaBCN film), an aluminum borocarbonitride film (AlBCN film), a molybdenum borocarbonitride film (MoBCN film), and the like.

In those cases, it is possible to perform the film formation by the same sequence as the above-described embodiments, by using a precursor gas containing a metal element and a halogen element instead of the chlorosilane-based precursor gas in the above-described embodiment. Examples of the precursor gas may include a precursor gas containing a metal element and a chloro group or a precursor gas containing a metal element and a fluoro group.

That is, a metallic thin film having a borazine ring skeleton and containing a metal element, B, C, and N is formed on the wafer 200 by performing a cycle a predetermined number of times. The cycle includes supplying a precursor gas containing a metal element and a halogen element to the wafer 200, and supplying a reaction gas including an organic borazine compound to the wafer 200. The cycle is performed under a condition in which the borazine ring skeleton in the organic borazine compound is maintained.

Moreover, a carbon-containing gas may be supplied to the wafer 200 in at least one of processes of supplying the precursor gas and supplying the reaction gas.

Further, a metal thin film having a borazine ring skeleton and containing a metal element, B, C, and N is formed on the wafer 200 by performing a cycle a predetermined number of times. The cycle includes: supplying a precursor gas containing a metal element and a halogen element to the wafer 200; supplying a reaction gas including an organic borazine compound to the wafer 200; and supplying a nitriding gas to the wafer 200. The cycle is performed under a condition in which the borazine ring skeleton in an organic borazine compound is maintained.

In addition, a carbon-containing gas may be supplied to the substrate, in at least one of processes of supplying the precursor gas, supplying the reaction gas, and supplying the nitriding gas.

Further, a metal thin film having a borazine ring skeleton and containing a metal element, B, C, and N is formed on the wafer 200 by performing a cycle a predetermined number of times. The cycle includes: supplying a precursor gas containing a metal element and a halogen element to the wafer 200; supplying a carbon-containing gas to the wafer 200; and supplying a reaction gas including an organic borazine compound to the wafer 200. The cycle under a condition in which the borazine ring skeleton in the organic borazine compound is maintained, In addition, the carbon-containing gas may be supplied to the substrate, in at least one of processes of supplying the precursor gas and supplying the reaction gas.

Furthermore, a metal thin film having a borazine ring skeleton and containing a metal element, B, C, and N is formed on the wafer 200 by performing a cycle a predetermined number of times. The cycle includes: supplying a precursor gas containing a metal element and a halogen element to the wafer 200; supplying a reaction gas including an organic borazine compound to the wafer 200; and supplying a gas containing N and C to the wafer 200. The cycle is performed under a condition in which the borazine ring skeleton in the organic borazine compound is maintained.

In addition, a carbon-containing gas may be supplied to the substrate, in at least one of processes of supplying the precursor gas, supplying the reaction gas, and supplying the gas containing N and C.

For example, when a Ti-based thin film is formed as a metal thin film, it is possible to use a precursor gas containing Ti and a chloro group such as titanium tetrachloride ($TiCl_4$) gas, a precursor gas containing Ti and a fluoro group such as titanium tetrafluoride ($TiF_4$) gas, and the like. As the reaction gas including the organic borazine compound, the nitriding gas, the carbon-containing gas, and the gas containing N and C, it is possible to use the same gases as those in the above-described embodiments. The processing conditions in this example may be the same processing conditions as those in the above-described embodiments.

Further, for example, when a Zr-based thin film is formed as a metal thin film, it is possible to use a precursor gas containing Zr and a chloro group such as zirconium tetrachloride ($ZrCl_4$) gas, a precursor gas including Zr and a fluoro group as a zirconium tetrafluoride ($ZrF_4$) gas, and the like. As the reaction gas including the organic borazine compound, the nitriding gas, the carbon-containing gas, and the gas containing N and C, it is possible to use the same gases as those in the above-described embodiments. The processing conditions in this example may be the same processing conditions as those in the above-described embodiments.

Furthermore, for example, when an Hf-based thin film is formed as a metallic thin film, it is possible to use a precursor gas containing Hf and a chloro group such as hafniumtetrachloride ($HfCl_4$) gas, and a precursor gas containing Hf and a fluoro group such as hafniumtetrafluoride ($HfF_4$) gas, as a precursor gas. As the reaction gas including the organic borazine compound, the nitriding gas, the carbon-containing gas, and the gas containing N and C, it is possible to use the same gases as those in the above-described embodiments. The processing conditions in this example may be the same processing conditions as those in the above-described embodiments.

Thus, the present disclosure may be applied not only to forming semiconductor-based thin films but to forming metal thin films, and the same effects as those in the above-described embodiments can also be achieved. As such, the present disclosure may be applied to a case of forming a thin film containing a predetermined element such as a semiconductor elements and a metal element.

In addition, a plurality of process recipes (e.g., programs describing process procedures and process conditions) used to form these various kinds of films may be individually prepared according to contents (e.g., kind, composition ratio, quality, thickness of films to be formed) of substrate processing. In addition, at the start of the substrate processing, an appropriate one of the plurality of process recipes may be selected according to the substrate processing contents. Specifically, the plurality of process recipes individually prepared according to the substrate processing contents may be stored (or installed) in the memory device 121c of the substrate processing via a telecommunication line or a recording medium (e.g., the external memory device 123) storing the process recipes. In addition, at the start of the substrate processing, the CPU 121a of the substrate processing apparatus may select an appropriate one of the plurality of process recipes stored in the memory device 121c, according to the substrate processing contents. This configuration allows a single substrate processing apparatus to form films having different kinds, composition ratios, qualities and thicknesses for general purposes and with high reproducibility. In addition, this configuration can reduce an operator's operation burden (a burden on input of process procedures and process conditions), thereby avoiding an operation error and starting the substrate processing quickly.

However, the above-mentioned process recipes may be prepared, for example, by modifying existing process recipes already installed in the substrate processing apparatus, without being limited to newly prepared ones. When the process recipes are modified, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

In addition, although the above embodiments illustrate that the batch type substrate processing apparatus to process a plurality of substrates at once is used to form the films, the present disclosure is not limited thereto but may be appropriately applied to film formation using a single wafer type substrate processing apparatus to process a single substrate or several substrates at once. In addition, although the above embodiments illustrate that the substrate processing apparatus including the hot wall type processing furnace is used to form the films, the present disclosure is not limited thereto but may be appropriately applied to a case where a substrate processing apparatus including a cold wall type processing furnace is used to form the films.

In addition, the above embodiments, modifications, and applications may be used in proper combinations.

<Aspects of the Present Disclosure>

Hereinafter, the preferred aspects of the present disclosure will be additionally stated.

(Supplementary Note 1)

According to an aspect of the present disclosure, there is provided a method of manufacturing a semiconductor device, the method including forming a thin film having a borazine ring skeleton and containing a predetermined element, boron, carbon, and nitrogen on a substrate by performing a cycle a first predetermined number of times, the cycle including: supplying a precursor gas containing the predetermined element and a halogen element to the substrate; supplying a reaction gas including an organic borazine compound to the substrate; and supplying a carbon-containing gas to the substrate, wherein the cycle is performed under a condition in which the borazine ring skeleton in the organic borazine compound is maintained.

(Supplementary Note 2)

In another aspect of the present disclosure, supplying the carbon-containing gas is performed in a period in which the reaction gas is supplied.

(Supplementary Note 3)

In another aspect of the present disclosure, supplying the carbon-containing gas is performed in a period in which supply of the reaction gas is halted (e.g., a period before the supply has started and/or a period after the supply has ended).

(Supplementary Note 4)

In another aspect of the present disclosure, supplying the precursor gas and supplying the reaction gas are alternately performed a second predetermined number of times.

(Supplementary Note 5)

In another aspect of the present disclosure, the carbon-containing gas includes a hydrocarbon-based gas.

(Supplementary Note 6)

In another aspect of the present disclosure, the cycle further includes supplying a nitriding gas to the substrate.

(Supplementary Note 7)

In another aspect of the present disclosure, the cycle includes: alternately performing supplying the precursor gas and supplying the reaction gas a second predetermined number of times; and performing supplying the nitriding gas.

(Supplementary Note 8)

In another aspect of the present disclosure, in supplying the nitriding gas, the nitriding gas activated by heat is supplied to the substrate.

(Supplementary Note 9)

In another aspect of the present disclosure, in supplying the nitriding gas, the nitriding gas activated by plasma is supplied to the substrate.

(Supplementary Note 10)

In another aspect of the present disclosure, the cycle further includes supplying a gas containing nitrogen and carbon to the substrate.

(Supplementary Note 11)

In another aspect of the present disclosure, the cycle includes: alternately performing supplying the precursor gas and supplying the reaction gas a second predetermined number of times; and performing supplying the gas containing nitrogen and carbon.

(Supplementary Note 12)

In another aspect of the present disclosure, the gas containing nitrogen and carbon includes at least one selected from the group consisting of an amine-based gas and an organic hydrazine-based gas.

(Supplementary Note 13)

In another aspect of the present disclosure, the predetermined element includes silicon or a metal element, and the halogen element includes chlorine or fluorine.

(Supplementary Note 14)

In another aspect of the present disclosure, the cycle is performed the first predetermined number of times under a non-plasma condition.

(Supplementary Note 15)

According to another aspect of the present disclosure, there is provided a method of processing a substrate, the method including forming a thin film having a borazine ring skeleton and containing a predetermined element, boron, carbon, and nitrogen on the substrate by performing a cycle a predetermined number of times, the cycle including: supplying a precursor gas containing the predetermined element and a halogen element to the substrate; supplying a reaction gas including an organic borazine compound to the substrate; and supplying a carbon-containing gas to the substrate, wherein the cycle is performed under a condition in which the borazine ring skeleton in the organic borazine compound is maintained.

(Supplementary Note 16)

According to still another aspect of the present disclosure, there is provided a substrate processing apparatus, including: a process chamber configured to accommodate a substrate; a precursor gas supply system configured to supply a precursor gas containing a predetermined element and a halogen element into the process chamber; a reaction gas supply system configured to supply a reaction gas including an organic borazine compound into the process chamber; a carbon-containing gas supply system configured to supply a carbon-containing gas into the process chamber; a heater configured to heat the substrate in the process chamber; a pressure adjuster configured to adjust an internal pressure of the process chamber; and a controller configured to control the precursor gas supply system, the reaction gas supply system, the carbon-containing gas supply system, the heater, and the pressure adjuster so as to form a thin film having a borazine ring skeleton and containing the predetermined element, boron, carbon, and nitrogen on the substrate by performing a cycle a predetermined number of times, the cycle including:

supplying the precursor gas to the substrate in the process chamber, supplying the reaction gas to the substrate in the process chamber, and supplying the carbon-containing gas to the substrate in the process chamber, wherein the cycle is performed under a condition in which the borazine ring skeleton in the organic borazine compound is maintained.

(Supplementary Note 17)

According to still another aspect of the present disclosure, there is provided a program that causes a computer to perform a process of forming a thin film having a borazine ring skeleton and containing a predetermined element, boron, carbon, and nitrogen on a substrate by performing a cycle a predetermined number of times, the cycle including: supplying a precursor gas containing the predetermined element and a halogen element to the substrate in a process chamber; supplying a reaction gas including an organic borazine compound to the substrate in the process chamber; and supplying a carbon-containing gas to the substrate in the process chamber, wherein the cycle is performed under a condition in which the borazine ring skeleton in the organic borazine compound is maintained (Supplementary Note 18)

According to still another aspect of the present disclosure, there is provided a non-transitory computer-readable recording medium storing a program that causes a computer to perform a process of forming a thin film having a borazine ring skeleton and containing a predetermined element, boron, carbon, and nitrogen on a substrate by performing a cycle a predetermined number of times, the cycle including: supplying a precursor gas containing the predetermined element and a halogen element to the substrate in a process chamber; supplying a reaction gas including an organic borazine compound to the substrate in the process chamber; and supplying a carbon-containing gas to the substrate in the process chamber, wherein the cycle is performed under a condition in which the borazine ring skeleton in the organic borazine compound is maintained.

According to the present disclosure in some embodiments, it is possible to form a thin film having a high resistance to HF and a low dielectric constant in a low temperature region with a high productivity While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising forming a thin film having a borazine ring skeleton and containing a predetermined element, boron, carbon, and nitrogen on a substrate by performing a cycle a first predetermined number of times, the cycle comprising:
   supplying a precursor gas containing the predetermined element and a halogen element to the substrate;
   supplying a reaction gas including an organic borazine compound to the substrate; and
   supplying a carbon-containing gas to the substrate, the carbon-containing gas including a hydrocarbon-based gas,
   wherein the cycle is performed under a condition in which the borazine ring skeleton in the organic borazine compound is maintained.

2. The method of claim 1, wherein the act of supplying the carbon-containing gas is performed in a period in which the reaction gas is supplied.

3. The method of claim 1, wherein the act of supplying the carbon-containing gas is performed in a period in which supply of the reaction gas is halted.

4. The method of claim 1, wherein the act of supplying the precursor gas and the act of supplying the reaction gas are alternately performed a second predetermined number of times.

5. The method of claim 1, wherein the cycle further comprises supplying a nitriding gas to the substrate.

6. The method of claim 5, wherein the cycle comprises: alternately performing the act of supplying the precursor gas and the act of supplying the reaction gas a second predetermined number of times; and performing the act of supplying the nitriding gas.

7. The method of claim 5, wherein in the act of supplying the nitriding gas, the nitriding gas activated by heat is supplied to the substrate.

8. The method of claim 5, wherein in the act of supplying the nitriding gas, the nitriding gas activated by plasma is supplied to the substrate.

9. The method of claim 1, wherein the cycle further comprises supplying a gas containing nitrogen and carbon to the substrate.

10. The method of claim 9, wherein the cycle comprises: alternately performing the act of supplying the precursor gas and the act of supplying the reaction gas a second predetermined number of times; and performing the act of supplying the gas containing nitrogen and carbon.

11. The method of claim 9, wherein the gas containing nitrogen and carbon includes at least one selected from the group consisting of an amine-based gas and an organic hydrazine-based gas.

12. A method of manufacturing a semiconductor device, the method comprising forming a thin film having a borazine ring skeleton and containing a predetermined element, boron, carbon, and nitrogen on a substrate by performing a cycle a predetermined number of times, the cycle comprising:
   supplying a precursor gas containing the predetermined element and a halogen element to the substrate, the predetermined element including silicon or a metal element, and the halogen element including chlorine or fluorine;
   supplying a reaction gas including an organic borazine compound to the substrate; and
   supplying a carbon-containing gas to the substrate,
   wherein the cycle is performed under a condition in which the borazine ring skeleton in the organic borazine compound is maintained.

13. A method of manufacturing a semiconductor device, the method comprising forming a thin film having a borazine ring skeleton and containing a predetermined element, boron, carbon, and nitrogen on a substrate by performing a cycle a predetermined number of times, the cycle comprising:
   supplying a precursor gas containing the predetermined element and a halogen element to the substrate,
   supplying a reaction gas including an organic borazine compound to the substrate; and
   supplying a carbon-containing gas to the substrate, wherein the cycle is performed under a condition in which the borazine ring skeleton in the organic borazine compound is maintained and under a non-plasma condition.

* * * * *